US012588304B2

(12) United States Patent
Choi et al.

(10) Patent No.: US 12,588,304 B2
(45) Date of Patent: Mar. 24, 2026

(54) IMAGE SENSOR INCLUDING A BURIED GATE

(71) Applicant: SAMSUNG ELECTRONICS CO., LTD., Suwon-si (KR)

(72) Inventors: Hyuksoon Choi, Suwon-si (KR); Daekun Ahn, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 406 days.

(21) Appl. No.: 18/053,744

(22) Filed: Nov. 8, 2022

(65) Prior Publication Data

US 2023/0144105 A1     May 11, 2023

(30) Foreign Application Priority Data

Nov. 9, 2021     (KR) ........................ 10-2021-0153341

(51) Int. Cl.
H10F 39/00 (2025.01)

(52) U.S. Cl.
CPC ..... H10F 39/8027 (2025.01); H10F 39/8023 (2025.01); H10F 39/8037 (2025.01); H10F 39/807 (2025.01)

(58) Field of Classification Search
CPC ............. H10F 39/8027; H10F 39/8023; H10F 39/8037; H10F 39/807; H10F 39/199; H10F 39/812; H10F 39/809; H10F 39/811; H10F 39/80373; H10F 39/802; H10F 39/18
USPC ....................................................... 257/440
See application file for complete search history.

(56) References Cited

U.S. PATENT DOCUMENTS

| 8,564,701 B2 | 10/2013 | Watanabe et al. |
| 9,356,067 B2 | 5/2016 | Shin |
| 10,483,304 B2 | 11/2019 | Lee et al. |
| 10,531,022 B2 | 1/2020 | Roy |
| 10,535,693 B2 | 1/2020 | Roy |

(Continued)

FOREIGN PATENT DOCUMENTS

| JP | 2016-119411 | 6/2016 |
| KR | 10-2014-0133814 A | 11/2014 |

(Continued)

OTHER PUBLICATIONS

Office Action dated Jul. 10, 2025 issued in corresponding Korean Patent Application No. 10-2021-0153341.

*Primary Examiner* — Mohammad M Hoque
(74) *Attorney, Agent, or Firm* — Morgan, Lewis & Bockius LLP

(57) ABSTRACT

An image sensor includes a semiconductor substrate including a first surface and a second surface and having a photoelectric conversion region disposed therein. A floating diffusion region is disposed within the semiconductor substrate. The floating diffusion region is adjacent to the first surface. A buried gate structure is disposed within a buried gate trench extending from the first surface of the semiconductor substrate towards an interior of the semiconductor substrate, the buried gate structure including a first buried gate electrode inside a first buried gate trench adjacent to a first side part of the floating diffusion region, and a second buried gate electrode inside a second buried gate trench spaced apart from the first buried gate trench and adjacent to a second side part of the floating diffusion region, the second side part being opposite to the first side part.

20 Claims, 21 Drawing Sheets

100

(56)     References Cited

U.S. PATENT DOCUMENTS

| | | | |
|---|---|---|---|
| 2006/0289911 A1* | 12/2006 | Lee | H10F 39/802 |
| | | | 257/292 |
| 2011/0049590 A1 | 3/2011 | Itonaga | |
| 2015/0029374 A1* | 1/2015 | Kitano | H10F 39/802 |
| | | | 257/292 |
| 2017/0207264 A1* | 7/2017 | Oh | H10F 39/807 |
| 2018/0151618 A1 | 5/2018 | Tsai | |
| 2020/0066780 A1 | 2/2020 | Roy et al. | |
| 2020/0135781 A1 | 4/2020 | Nakagawa | |
| 2021/0036039 A1* | 2/2021 | Lee | H10F 39/8053 |
| 2021/0351223 A1* | 11/2021 | Nomoto | H10F 39/802 |
| 2021/0361223 A1 | 11/2021 | Nomoto | |
| 2023/0246042 A1* | 8/2023 | Kurihara | H10F 39/8033 |
| | | | 250/208.1 |

FOREIGN PATENT DOCUMENTS

| | | |
|---|---|---|
| KR | 10-1640260 B1 | 7/2016 |
| KR | 10-2018-0081869 A | 7/2018 |
| KR | 10-2021-0049103 A | 5/2021 |
| WO | WO 2020/05428 | 3/2020 |

* cited by examiner

100

IMAGE SENSOR INCLUDING A BURIED GATE

CROSS-REFERENCE TO RELATED APPLICATION

This application is based on and claims priority under 35 U.S.C. § 119 to Korean Patent Application No. 10-2021-0153341, filed on Nov. 9, 2021 in the Korean Intellectual Property Office, the disclosure of which is incorporated by reference herein in its entirety.

TECHNICAL FIELD

The present disclosure relates to an image sensor, and more particularly, to an image sensor including a buried gate.

DISCUSSION OF THE RELATED ART

An image sensor converts an optical image signal into an electrical signal. An image sensor includes a plurality of pixels each receiving incident light and converting the incident light into an electrical signal using a photodiode region thereof. As the degree of integration of an image sensor increases, the size of each pixel becomes smaller, and accordingly, the charge transfer efficiency of each pixel decreases.

SUMMARY

An image sensor includes a semiconductor substrate including a first surface and a second surface and having a photoelectric conversion region therein. A floating diffusion region is disposed within the semiconductor substrate. The floating diffusion region is adjacent to the first surface. A buried gate structure is disposed within a buried gate trench extending from the first surface of the semiconductor substrate towards an interior of the semiconductor substrate. The buried gate structure includes a first buried gate electrode disposed within a first buried gate trench that is adjacent to a first side part of the floating diffusion region and a second buried gate electrode disposed within a second buried gate trench that is spaced apart from the first buried gate trench and adjacent to a second side part of the floating diffusion region that is opposite to the first side part.

An image sensor includes a stack structure including a first substrate and a second substrate that are stacked upon one another. An active pixel region includes a plurality of pixels. A pad region is disposed on at least one side of the active pixel region. The first substrate includes a first semiconductor substrate including a first surface and a second surface and having a photoelectric conversion region therein. At least a part of a first buried gate electrode extends from the first surface of the first semiconductor substrate towards an interior of the first semiconductor substrate. At least a part of the second buried gate electrode extends from the first surface of the first semiconductor substrate towards an interior of the first semiconductor substrate and is spaced apart from the first buried gate electrode. A floating diffusion region is disposed within the first semiconductor substrate and is at least partially surrounded by the first buried gate electrode and the second buried gate electrode.

An image sensor includes a stack structure including a first substrate and a second substrate that are stacked upon one another. A plurality of pixels are defined within an active pixel region. A pad region is disposed on at least one side of the active pixel region. The first substrate includes a first semiconductor substrate including a first surface and a second surface and having a photoelectric conversion region disposed therein. A floating diffusion region is disposed within the first semiconductor substrate. A floating diffusion region is adjacent to the first surface. A first buried gate electrode is disposed within a first buried gate trench extending from the first surface of the first semiconductor substrate towards an interior of the semiconductor substrate. The first buried gate electrode is disposed on a first side part of the floating diffusion region. A second buried gate electrode is disposed within a second buried gate trench extending from the first surface of the first semiconductor substrate towards an interior of the first semiconductor substrate and is spaced apart from the first buried gate trench. The second buried gate electrode is further disposed on a second side part of the floating diffusion region, which is opposite to the first side part, wherein the first buried gate electrode and the second buried gate electrode at least partially surround the floating diffusion region. The second substrate includes a logic circuit configured to drive the plurality of pixels.

BRIEF DESCRIPTION OF THE DRAWINGS

Embodiments of the inventive concept will be more clearly understood from the following detailed description taken in conjunction with the accompanying drawings, in which.

DETAILED DESCRIPTION OF THE EMBODIMENTS

Hereinafter, example embodiments of the inventive concept are described in detail with reference to the accompanying drawings.

Figure 1:
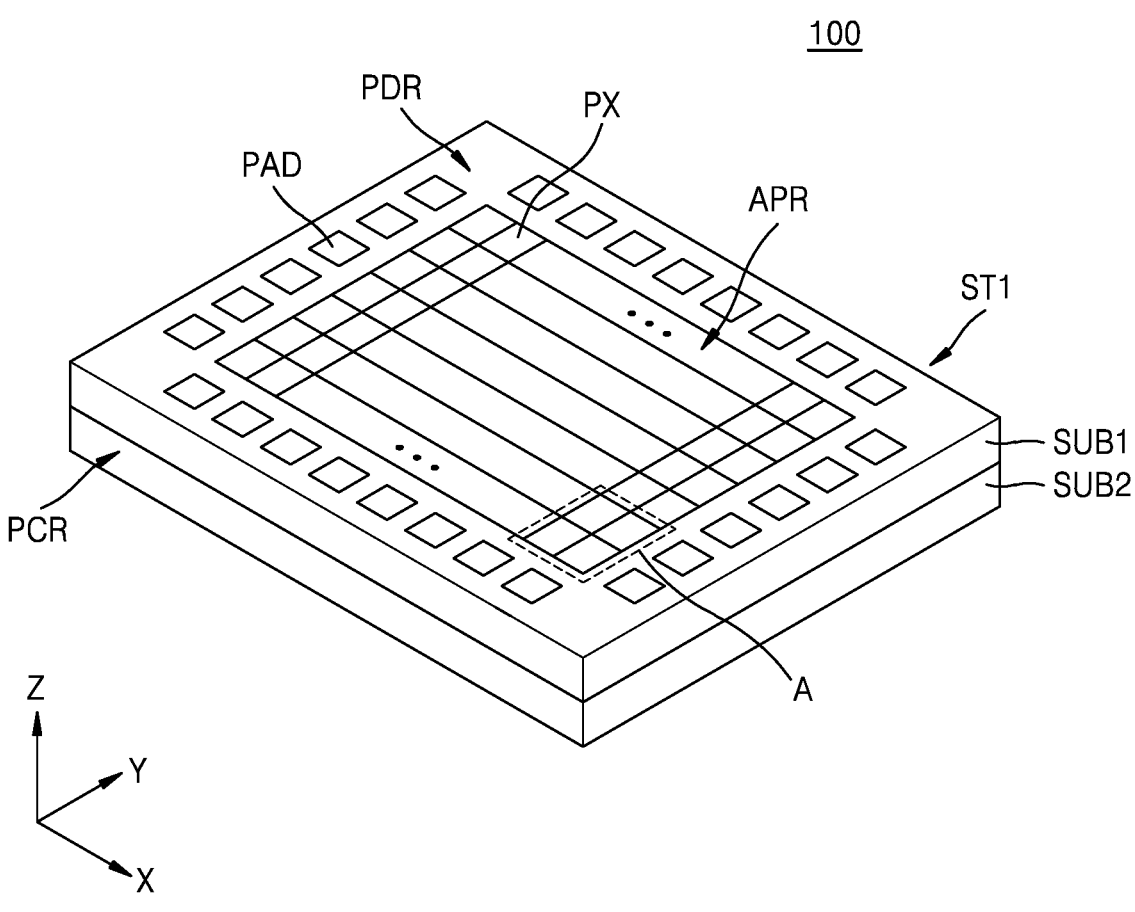
FIG. 1 is a perspective view schematically illustrating an image sensor according to example embodiments.
Figure 2:
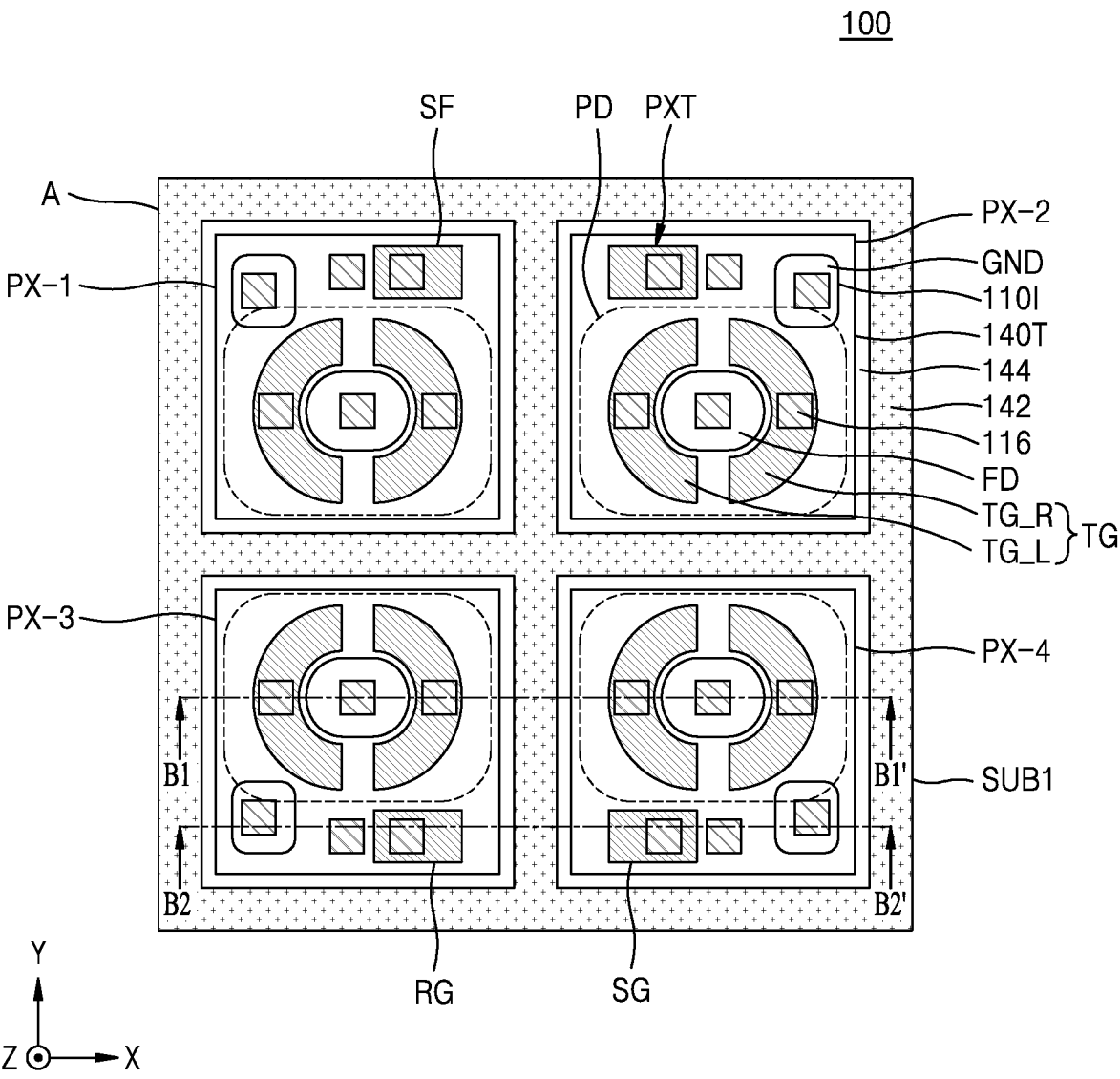
FIG. 2 is a magnified layout diagram of a part A of FIG. 1.
Figure 3:
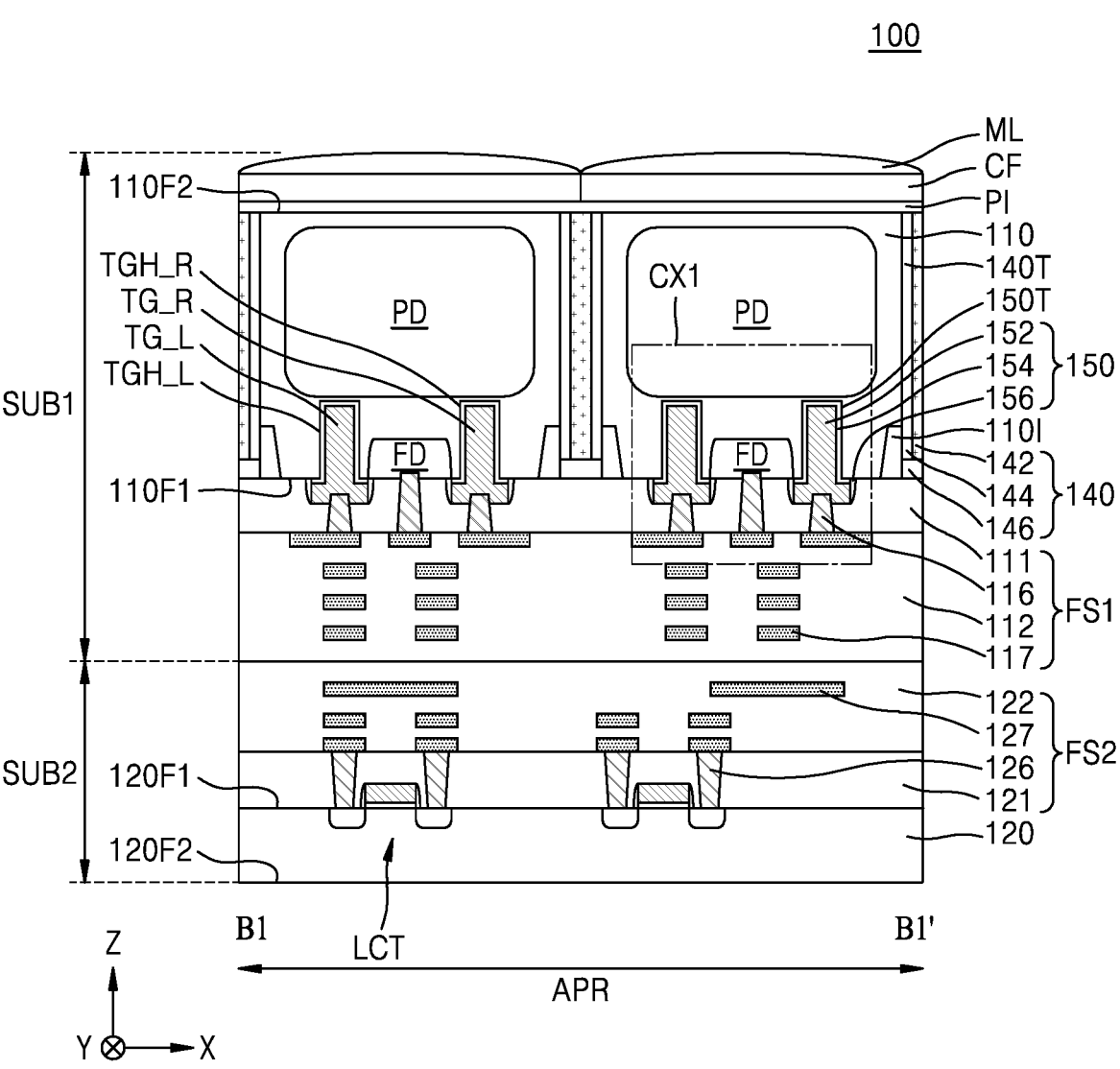
FIG. 3 is a cross-sectional view taken along line B1-B1' of FIG. 2.
Figure 4:
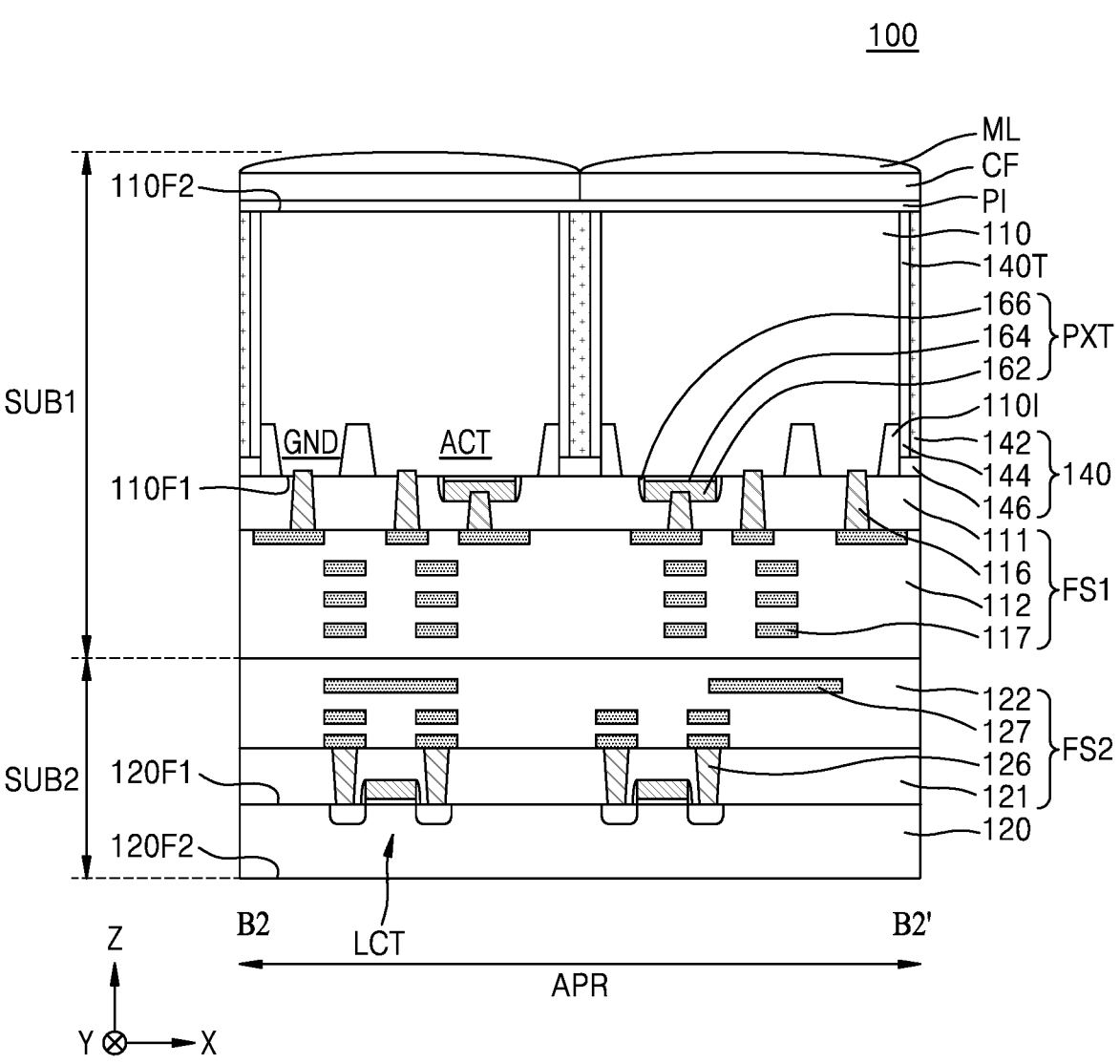
FIG. 4 is a cross-sectional view taken along line B2-B2' of FIG. 2.
Figure 5:
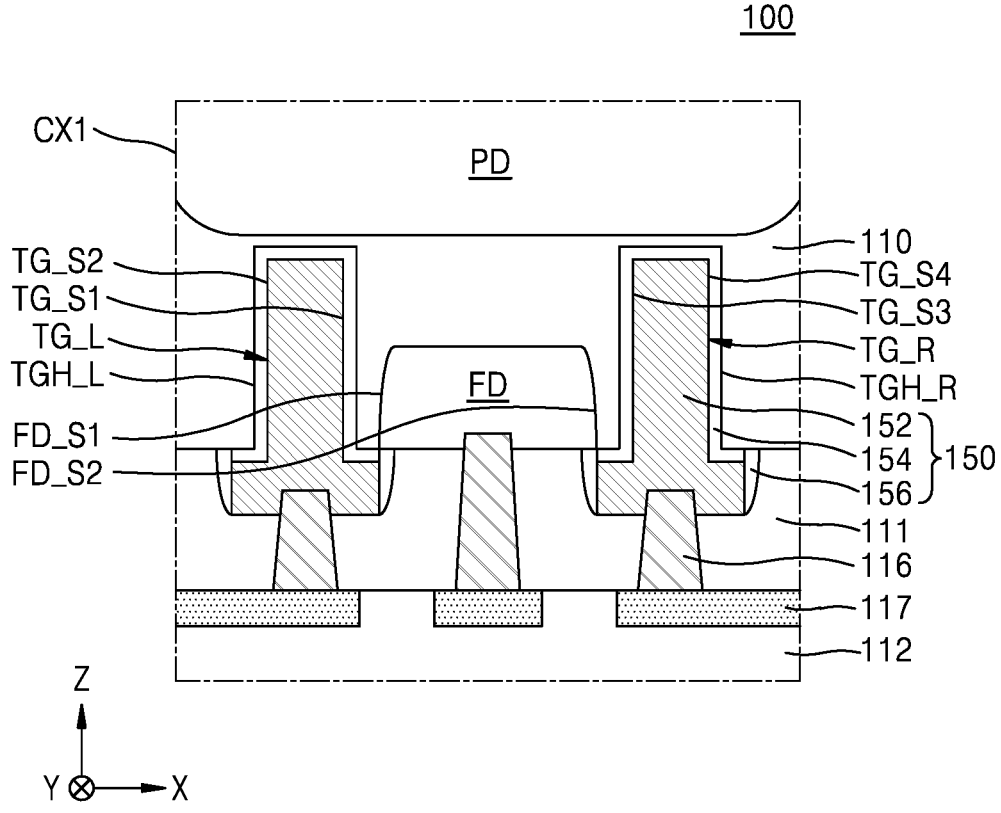
FIG. 5 is a magnified view of a part CX1 of FIG. 3.
Figure 6:
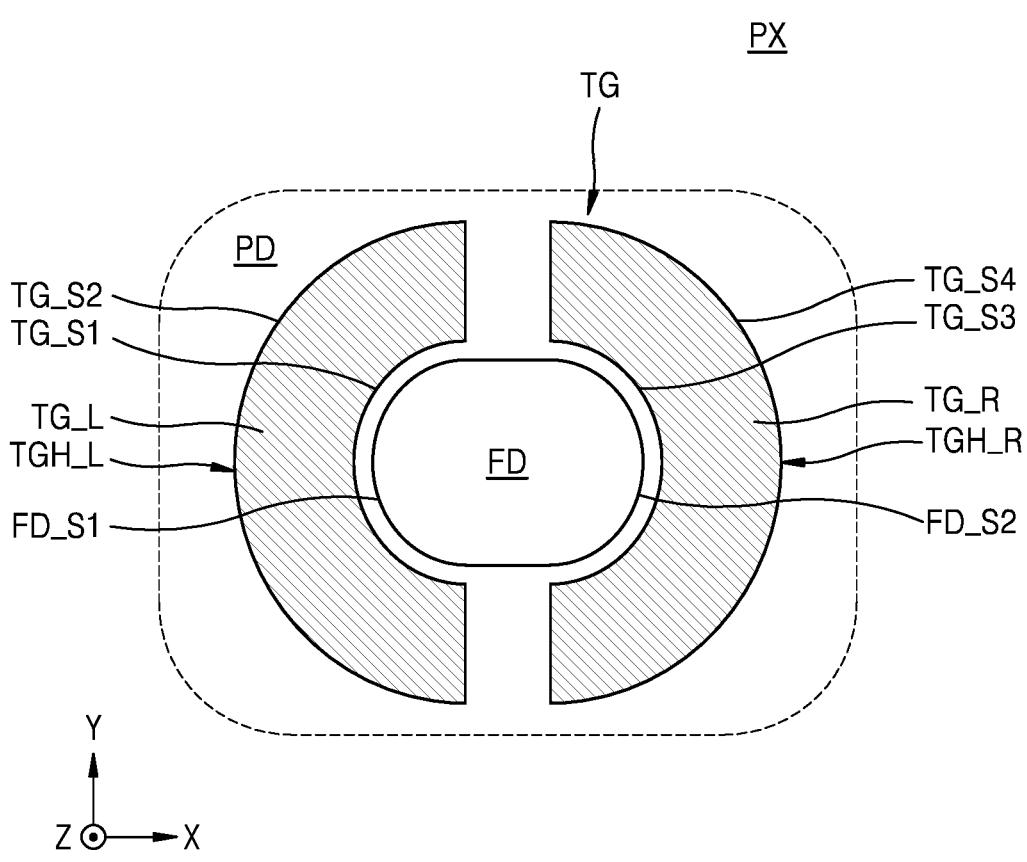
FIG. 6 is a layout diagram schematically illustrating an arrangement of a floating diffusion region and a transfer gate corresponding to one pixel.

FIG. 1 is a perspective view schematically illustrating an image sensor 100 according to example embodiments. FIG. 2 is a magnified layout diagram of a part A of FIG. 1. FIG. 3 is a cross sectional view taken along line B1-B1' of FIG. 2. FIG. 4 is a cross-sectional view taken along line B2-B2' of FIG. 2. FIG. 5 is a magnified view of a part CX1 of FIG. 3. FIG. 6 is a layout diagram schematically illustrating an arrangement of a floating diffusion region FD and a transfer gate TG corresponding to one pixel PX.

Referring to FIGS. 1 to 6, the image sensor 100 may be a stack-type image sensor including a stack structure ST1 in which a first substrate SUB1 and a second substrate SUB2 are stacked upon one another in a vertical (e.g., Z) direction.

An active pixel region APR may be disposed at a center part of the stack structure ST1. A plurality of pixels PX may be disposed in the active pixel region APR. The plurality of pixels PX may be a region configured to receive light from outside of the stack structure ST1 and convert the received light into an electrical signal. The plurality of pixels PX may be disposed in the first substrate SUB1, and for example, a photoelectric conversion region PD configured to receive light from the outside and transistors constituting a pixel circuit configured to convert photocharges accumulated in the photoelectric conversion region PD into an electrical signal may be disposed within the first substrate SUB1.

A pad region PDR may be disposed on at least one side of the active pixel region APR, for example, on four side surfaces of the active pixel region APR in a plan view. A plurality of pads PAD may be disposed within the pad region PDR and configured to transmit and receive an electrical signal to and from an external device, and the like.

A peripheral circuit region PCR may be disposed within the second substrate SUB2 and may include a logic circuit block and/or a memory device. For example, the logic circuit block may include a plurality of logic transistors LCT and provide a certain signal to each pixel PX in the active pixel region APR or control an output signal in each pixel PX. For example, the logic transistor LCT may include a row decoder, a row driver, a column decoder, a timing generator, a correlated double sampler (CDS), an analog to digital converter, and/or an input/output (I/O) buffer.

The active pixel region APR may include the plurality of pixels PX, and a plurality of photoelectric conversion regions PD may be respectively disposed in the plurality of pixels PX. In the active pixel region APR, the plurality of pixels PX may be arranged in a matrix form with rows and columns in a first direction X that is parallel to an upper surface of a first semiconductor substrate 110 and in a second direction Y that is perpendicular to the first direction X and parallel to the upper surface of the first semiconductor substrate 110. Some of the plurality of pixels PX may be optical black pixels. The optical black pixel may function as a reference pixel for the active pixel region APR and function to automatically correct a dark signal.

The first substrate SUB1 may include the first semiconductor substrate 110, a first front structure FS1 disposed on a first surface 110F1 of the first semiconductor substrate 110, and a color filter CF and a microlens ML disposed on a second surface 110F2 of the first semiconductor substrate 110. The second substrate SUB2 may include a second semiconductor substrate 120 and a second front structure FS2 disposed on a first surface 120F1 of the second semiconductor substrate 120. The second semiconductor substrate 120 may include the first surface 120F1 and a second surface 120F2 opposite to the first surface 120F1.

For example, the second front structure FS2 disposed within the second substrate SUB2 may face and be in contact with the first front structure FS1 disposed within the first substrate SUB1.

In example embodiments, the first and second semiconductor substrates 110 and 120 may include a P-type semiconductor substrate. For example, the first and/or second semiconductor substrates 110 and 120 may include a P-type silicon substrate. The first and/or second semiconductor substrates 110 and 120 may include a P-type bulk substrate and a P-type or N-type epitaxial layer grown thereon in example embodiments and include an N-type bulk substrate and a P-type or N-type epitaxial layer grown thereon in example embodiments.

The first front structure FS1 may include a first insulating layer 111 and a second insulating layer 112 disposed on the first surface 110F1 of the first semiconductor substrate 110. The first front structure FS1 may further include a conductive via 116 passing through the first insulating layer 111, and a wiring layer 117 disposed within the second insulating layer 112. For example, the first and second insulating layers 111 and 112 may include silicon oxide, silicon nitride, silicon oxynitride, and/or silicon carbonitride. In addition, each of the first and second insulating layers 111 and 112 may include a stack structure of a plurality of insulating layers, and an additional insulating liner may be further included between every two of the plurality of insulating layers.

The second front structure FS2 may include a first insulating layer 121 and a second insulating layer 122 disposed on the first surface 120F1 of the second semiconductor substrate 120. The first insulating layer 121 may cover the logic transistor LCT on the first surface 120F1 of the second semiconductor substrate 120. The second front structure FS2 may further include a conductive via 126 passing through the first insulating layer 121, and a wiring layer 127 disposed within the second insulating layer 122. The conductive via 126 and the wiring layer 127 may be electrically connected to the logic transistor LCT.

In example embodiments, the conductive vias 116 and 126 and the wiring layers 117 and 127 may include copper (Cu), aluminum (Al), tungsten (W), titanium (Ti), titanium nitride (TiN), tantalum (Ta), tantalum nitride (TaN), ruthenium (Ru), and/or tungsten nitride (WN).

The first substrate SUB1 and the second substrate SUB2 may be disposed so that the first front structure FS1 and the second front structure FS2 face each other, for example, the second insulating layer 112 of the first front structure FS1 is in contact with the second insulating layer 122 of the second front structure FS2.

In the active pixel region APR, a pixel isolation structure 140 may be disposed within the first substrate SUB1. The plurality of pixels PX may be defined by the pixel isolation structure 140. The pixel isolation structure 140 may include a conductive layer 142, an insulating liner 144, and an upper insulating layer 146. The conductive layer 142 may be disposed within a pixel trench 140T passing through the first semiconductor substrate 110. The insulating liner 144 may be disposed on an inner wall of the pixel trench 140T passing through the first semiconductor substrate 110, extend from the first surface 110F1 of the first semiconductor substrate 110 to the second surface 110F2, and be disposed between the conductive layer 142 and the first semiconductor substrate 110. The upper insulating layer 146 may be disposed within a part of the pixel trench 140T and may be adjacent to the first surface 110F1 of the first semiconductor substrate 110.

In example embodiments, the conductive layer 142 may include doped polysilicon, a metal, a metal silicide, a metal nitride, and/or a metal-containing layer. The insulating liner 144 may include a metal oxide such as hafnium oxide, aluminum oxide, or tantalum oxide. In this case, the insulating liner 144 may function as a negative fixed charge layer. In example embodiments, the insulating liner 144 may include an insulating material such as silicon oxide, silicon nitride, or silicon oxynitride. The upper insulating layer 146 may include an insulating material such as silicon oxide, silicon nitride, or silicon oxynitride.

Within the first substrate SUB1, the plurality of photoelectric conversion regions PD may be respectively arranged in the plurality of pixels PX. For example, one photoelectric conversion region PD may be arranged in each pixel PX. The photoelectric conversion region PD may be doped with an n-type impurity. For example, the photoelectric conversion region PD may have a potential gradient with an impurity density difference between an upper part and a lower part thereof. Alternatively, the photoelectric conversion region PD may be formed in a form in which a plurality of impurity regions are stacked in the vertical direction.

In the active pixel region APR, a buried gate structure 150 and the floating diffusion region FD may be disposed within the first substrate SUB1.

For example, the floating diffusion region FD may be disposed within the first semiconductor substrate 110 and may be adjacent to the first surface 110F1 of the first semiconductor substrate 110. The floating diffusion region FD may be doped with an n-type impurity. For example, the floating diffusion region FD may have a circular or oval horizontal cross-section and have a first side part FD_S1 and a second side part FD_S2 opposite to the first side part FD_S1.

A buried gate trench 150T extending from the first surface 110F1 of the first semiconductor substrate 110 towards an interior of the first semiconductor substrate 110 may be around the floating diffusion region FD, and the buried gate structure 150 may be disposed within the buried gate trench 150T.

For example, the buried gate trench 150T may include a first buried gate trench TGH_L and a second buried gate trench TGH_R, the first buried gate trench TGH_L may be adjacent to the first side part FD_S1 of the floating diffusion region FD, and the second buried gate trench TGH_R may be spaced apart from the first buried gate trench TGH_L and adjacent to the second side part FD_S2 of the floating diffusion region FD. For example, in a plan view, the first buried gate trench TGH_L and the second buried gate trench TGH_R may at least partially surround the floating diffusion region FD.

The buried gate structure 150 may include a first buried gate electrode TG_L disposed within the first buried gate trench TGH_L, and a second buried gate electrode TG_R disposed within the second buried gate trench TGH_R. For example, in a plan view, each of the first buried gate electrode TG_L and the second buried gate electrode TG_R may have a semi-circular horizontal cross-section or a semi-annular horizontal cross-section and may surround a part of the floating diffusion region FD. For example, in a plan view, the first buried gate electrode TG_L and the second buried gate electrode TG_R may at least partially surround the periphery of the floating diffusion region FD.

As shown in FIG. 6, the first buried gate electrode TG_L and the second buried gate electrode TG_R may be mirror symmetrical with respect to each other with the floating diffusion region FD disposed therebetween. The first buried gate electrode TG_L may include a first side wall TG_S1 facing the first side part FD_S1 of the floating diffusion region FD and a second side wall TG_S2 opposite to the first side wall TG_S1, and the second buried gate electrode TG_R may include a third side wall TG_S3 facing the second side part FD_S2 of the floating diffusion region FD and a fourth side wall TG_S4 opposite to the third side wall TG_S3. The first side wall TG_S1 and the third side wall TG_S3 may be mirror symmetrical with respect to each other with the floating diffusion region FD disposed therebetween, and the second side wall TG_S2 and the fourth side wall TG_S4 may be mirror symmetrical with respect to each other with the floating diffusion region disposed FD therebetween.

As shown in FIG. 6, each of the first buried gate electrode TG_L and the second buried gate electrode TG_R may have a semi-circular doughnut-shaped planar shape surrounding a part of the floating diffusion region FD. For example, the first buried gate electrode TG_L may have a semi-circular horizontal cross-section and may surround a part of the floating diffusion region FD, and the second buried gate electrode TG_R may have a semi-circular horizontal cross-section and may surround the other part of the floating diffusion region FD.

The photoelectric conversion region PD may overlap both the first buried gate electrode TG_L and second buried gate electrode TG_R in the vertical direction. The first buried gate electrode TG_L and the second buried gate electrode TG_R may constitute a transfer transistor TX (see FIG. 7), and the transfer transistor TX may be configured to transfer charges generated in the photoelectric conversion region PD to the floating diffusion region FD.

By arranging the first buried gate electrode TG_L and the second buried gate electrode TG_R and may be spaced apart from each other and to at least partially surround the periphery of the floating diffusion region FD, a ratio of a planar area of the buried gate structure 150 (e.g., a sum of a planar area of the first buried gate electrode TG_L and a planar area of the second buried gate electrode TG_R) to a planar area of the floating diffusion region FD may be relatively large, and accordingly, an operating voltage of a relatively low level may be applied to the buried gate structure 150. Alternatively, by arranging the first buried gate electrode TG_L and the second buried gate electrode TG_R and may be spaced apart from each other and may at least partially surround the periphery of the floating diffusion region FD, charge transfer efficiency for transferring charges generated in the photoelectric conversion region PD from the photoelectric conversion region PD to the floating diffusion region FD may be increased.

In example embodiments, the buried gate structure 150 may include a gate electrode 152, a gate insulating layer 154, and a spacer 156. For example, the gate electrode 152 may extend from the first surface 110F1 of the first semiconductor substrate 110 towards an interior of the buried gate trench 150T. The gate insulating layer 154 may extend from the first surface 110F1 of the first semiconductor substrate 110 towards an interior of the buried gate trench 150T and be disposed between the gate electrode 152 and the first semiconductor substrate 110. The spacer 156 may be disposed on a side wall of the gate electrode 152 and on the first surface 110F1 of the first semiconductor substrate 110. As shown in FIG. 3, an upper surface of the gate electrode 152 of the buried gate structure 150 may be at a higher level than the first surface 110F1 of the first semiconductor substrate 110 (e.g., a distance from the second surface 110F2 of the first semiconductor substrate 110 to the upper surface of the gate electrode 152 may be greater than a distance from the second surface 110F2 of the first semiconductor substrate 110 to the first surface 110F1).

In the active pixel region APR, a pixel gate PXT constituting a pixel circuit may be further disposed within the first substrate SUB1. For example, a device isolation layer 110I limiting an active region ACT and a ground region GND may be disposed on the first surface 110F1 of the first semiconductor substrate 110, and the pixel gate PXT may be disposed on the first surface 110F1 of the first semiconductor substrate 110. The pixel gate PXT may include a gate electrode 162, a gate insulating layer 164, and a spacer 166. An impurity region may be disposed within the first semiconductor substrate 110 and may be adjacent to the pixel gate PXT. The gate electrode 162 may include doped polysilicon, a metal, a metal silicide, a metal nitride, and/or a metal-containing layer.

In example embodiments, the pixel gate PXT may include a source follower gate SF, a select gate SG, and a reset gate RG.

In example embodiments, the reset gate RG may constitute a reset transistor RX (see FIG. 7), and the reset transistor RX may be configured to periodically reset charges stored in the floating diffusion region FD. The source follower gate SF may constitute a drive transistor DX (see FIG. 7), and the drive transistor DX may act as a source follower buffer amplifier and be configured to buffer a signal according to charges charged in the floating diffusion region FD. The select gate SG may constitute a select transistor SX (see FIG. 7), and the select transistor SX may function to perform switching and addressing for selecting a pixel PX.

In some example embodiments, as shown in FIG. 2, a first pixel PX-1, a second pixel PX-2, a third pixel PX-3, and a fourth pixel PX-4 may be arranged in a matrix form. Each of the first to fourth pixels PX-1, PX-2, PX-3, and PX-4 may have the transfer gate TG and the floating diffusion region FD. The first pixel PX-1 and the third pixel PX-3 arranged in order in the second direction Y may be mirror symmetrical with respect to each other, and the first pixel PX-1 and the second pixel PX-2 arranged in order in the first direction X may be mirror symmetrical with respect to each other. Each of the first to fourth pixels PX-1, PX-2, PX-3, and PX-4 may include the reset gate RG, the source follower gate SF, and the select gate SG. The layout of the pixels PX shown in FIG. 2 are illustrative, and for example, sizes, shapes, positions, and the like of the reset gate RG, the source follower gate SF, and the select gate SG are not necessarily limited to those shown in FIG. 2.

A vertical via passing through the first front structure FS1 and the second front structure FS2 in the pad region PDR and electrically connecting the logic transistor LCT to the plurality of pixels PX may be further disposed. By the vertical via, power and a signal may be transferred from an external device to the logic transistor LCT disposed within the second substrate SUB2.

A passivation layer PI may be disposed on the second surface 110F2 of the first semiconductor substrate 110, and the color filter CF and the microlens ML may be disposed on the passivation layer PI. The passivation layer PI may include an insulating material such as silicon oxide, silicon nitride, silicon oxynitride, or a low-k dielectric material (as used herein, a low-k dielectric material may be a material having a dielectric constant lower than that of silicon oxide).

In general, the floating diffusion region FD may be disposed on one side of the transfer gate TG and configured to transfer charges from the photoelectric conversion region PD to the floating diffusion region FD by a voltage applied to the transfer gate TG. Along with a decrease in pixel sizes of image sensors, charge transfer efficiency may decrease because electrical coupling occurs between the transfer gate TG and the floating diffusion region FD, or unexpected charge movement from the photoelectric conversion region PD is caused by a field generated due to a voltage applied to the transfer gate TG.

However, according to the embodiments described above, the image sensor 100 includes the first buried gate electrode TG_L at least partially surrounding the first side part FD_S1 of the floating diffusion region FD and the second buried gate electrode TG_R at least partially surrounding the second side part FD_S2 of the floating diffusion region FD. Accordingly, charge transfer efficiency of charges transferred from the photoelectric conversion region PD to the floating diffusion region FD may be increased.

Figure 7:
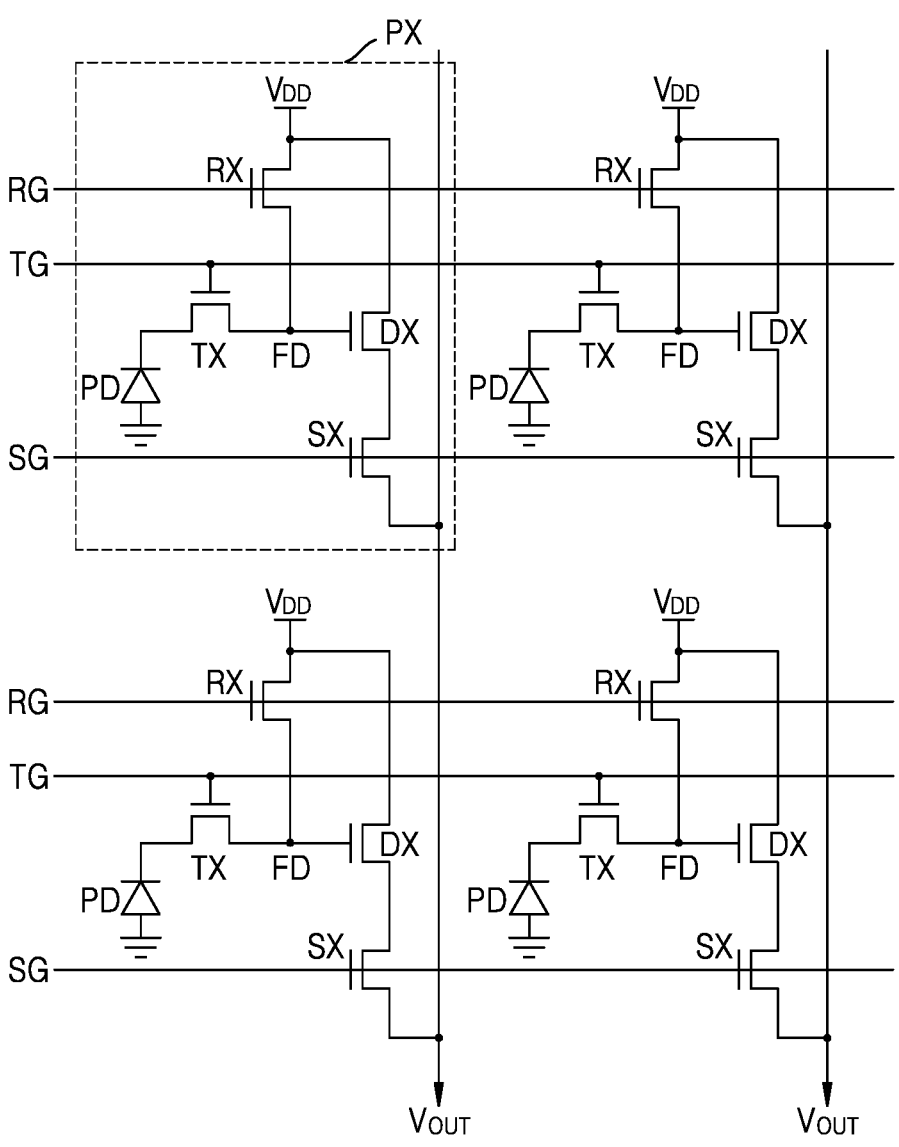
FIG. 7 is an equivalent circuit diagram of pixels of an image sensor according to example embodiments.

FIG. 7 is an equivalent circuit diagram of pixels of an image sensor according to example embodiments.

Referring to FIG. 7, a plurality of pixels PX may be arranged in a matrix form. Each of the plurality of pixels PX may include the transfer transistor TX and pixel transistors. Herein, the pixel transistors may include the reset transistor RX, the select transistor SX, and the drive transistor DX (or a source follower transistor). The reset transistor RX may include the reset gate RG, the select transistor SX may include the select gate SG, the drive transistor DX may include the source follower gate SF, and the transfer transistor TX may include the transfer gate TG.

Each of the plurality of pixels PX may further include the photoelectric conversion region PD and the floating diffusion region FD. The photoelectric conversion region PD may correspond to the photoelectric conversion region PD described with reference to FIGS. 1 to 6. The photoelectric conversion region PD may generate and accumulate photocharges in proportion to the intensity of light incident from the outside and use a photodiode, a photo transistor, a photo gate, a pinned photodiode (PPD), or a combination thereof.

The transfer gate TG may transfer charges generated in the photoelectric conversion region PD to the floating diffusion region FD. The floating diffusion region FD may receive charges generated in the photoelectric conversion region PD and cumulatively store the received charges. The drive transistor DX may be controlled according to an amount of photocharges accumulated in the floating diffusion region FD.

The reset transistor RX may periodically reset charges accumulated in the floating diffusion region FD. A drain electrode of the reset transistor RX is connected to the floating diffusion region FD, and a source electrode of the reset transistor RX is connected to a power source voltage $V_{DD}$. When the reset transistor RX is turned on, the power source voltage $V_{DD}$ connected to the source electrode of the reset transistor RX is transferred to the floating diffusion region FD. When the reset transistor RX is turned on, charges accumulated in the floating diffusion region FD may be discharged so that the floating diffusion region FD is reset.

The drive transistor DX is connected to a current source outside of the plurality of pixels PX to function as a source follower buffer amplifier, amplifies a potential change in the floating diffusion region FD, and outputs the amplified potential change to an output line $V_{OUT}$.

The select transistor SX may select a plurality of pixels PX in a row unit, and when the select transistor SX is turned on, the power source voltage $V_{DD}$ may be transferred to a source electrode of the drive transistor DX.

Figure 8:
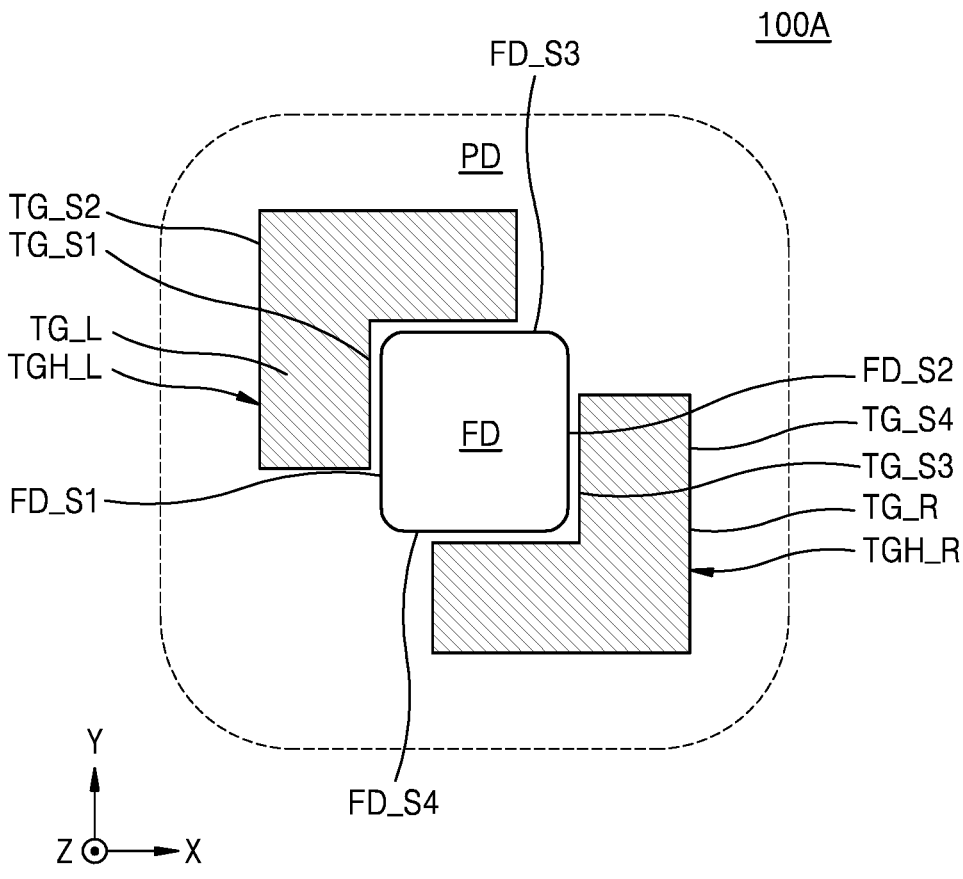
FIG. 8 is a plan view schematically illustrating an image sensor according to example embodiments.

FIG. 8 is a plan view schematically illustrating an image sensor 100A according to example embodiments. In FIG. 8, like reference numerals in FIGS. 1 to 7 may denote like elements.

Referring to FIG. 8, the floating diffusion region FD may have a quadrangular or rounded quadrangular horizontal cross-section and have the first side part FD_S1, the second side part FD_S2 opposite to the first side part FD_S1, a third side part FD_S3, and a fourth side part FD_S4 opposite to the third side part FD_S3. For example, the third side part FD_S3 may be disposed between the first side part FD_S1 and the second side part FD_S2.

The first buried gate electrode and the second buried gate electrode TG_R may collectively surround the periphery of the floating diffusion region FD. As shown in FIG. 8, each of the first buried gate electrode TG_L and the second buried gate electrode TG_R may have an L-shaped horizontal cross-section and may at least partially surround two side surfaces of the floating diffusion region FD. For example, the first buried gate electrode TG_L may have the first side wall TG_S1 at least partially surrounding the first side part FD_S1 and the third side part FD_S3 of the floating diffusion region FD. The second buried gate electrode TG_R may have the second side wall TG_S2 at least partially surrounding the second side part FD_S2 and the fourth side part FD_S4 of the floating diffusion region FD.

The first buried gate electrode TG_L and the second buried gate electrode TG_R may be mirror symmetrical with respect to each other with the floating diffusion region FD therebetween. However, the inventive concept is not necessarily limited thereto, and a shape and/or a size of the first buried gate electrode TG_L may differ from a shape and/or a size of the second buried gate electrode TG_R.

Figure 9:
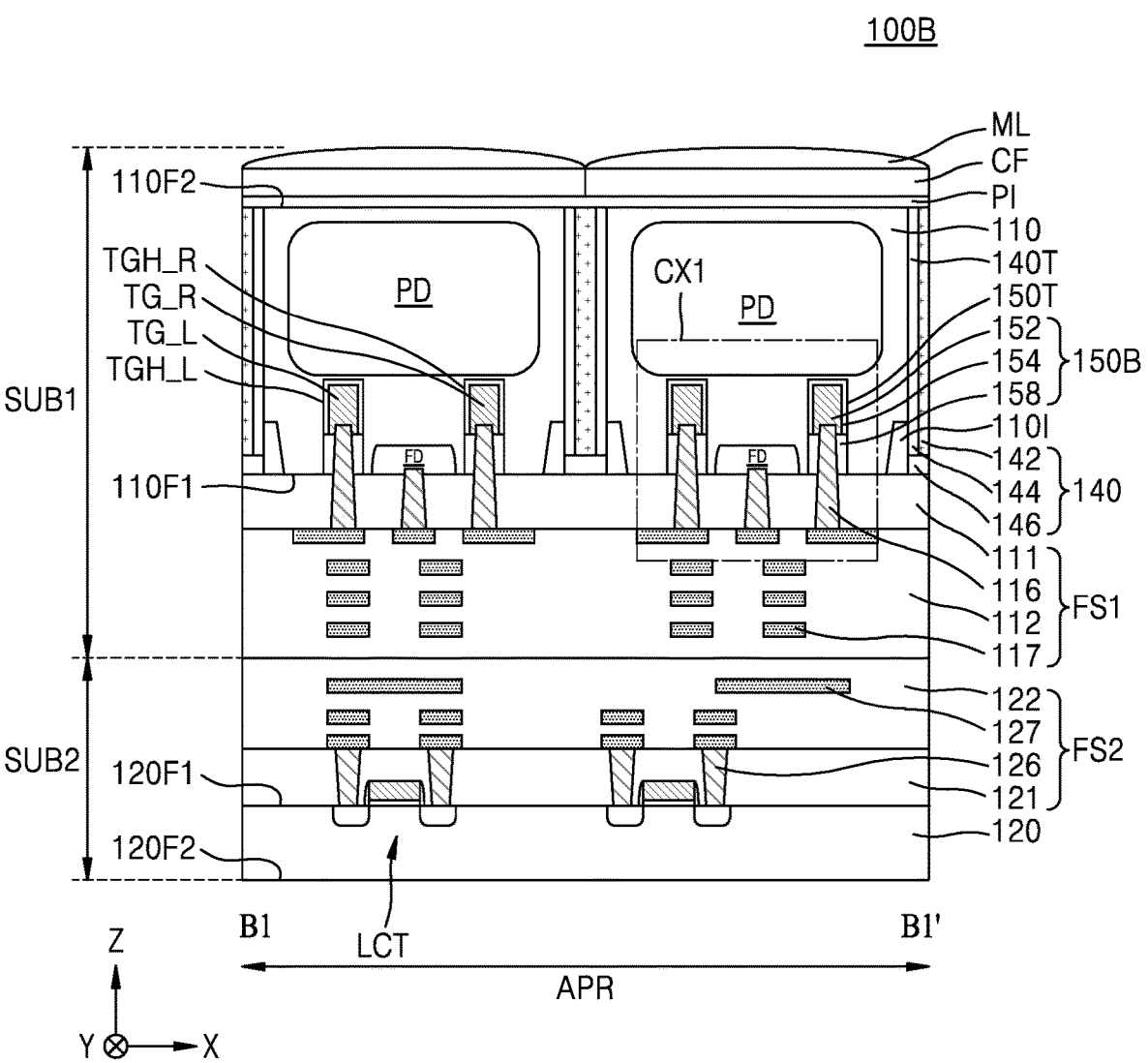
FIG. 9 is a cross-sectional view illustrating an image sensor according to example embodiments.
Figure 10:
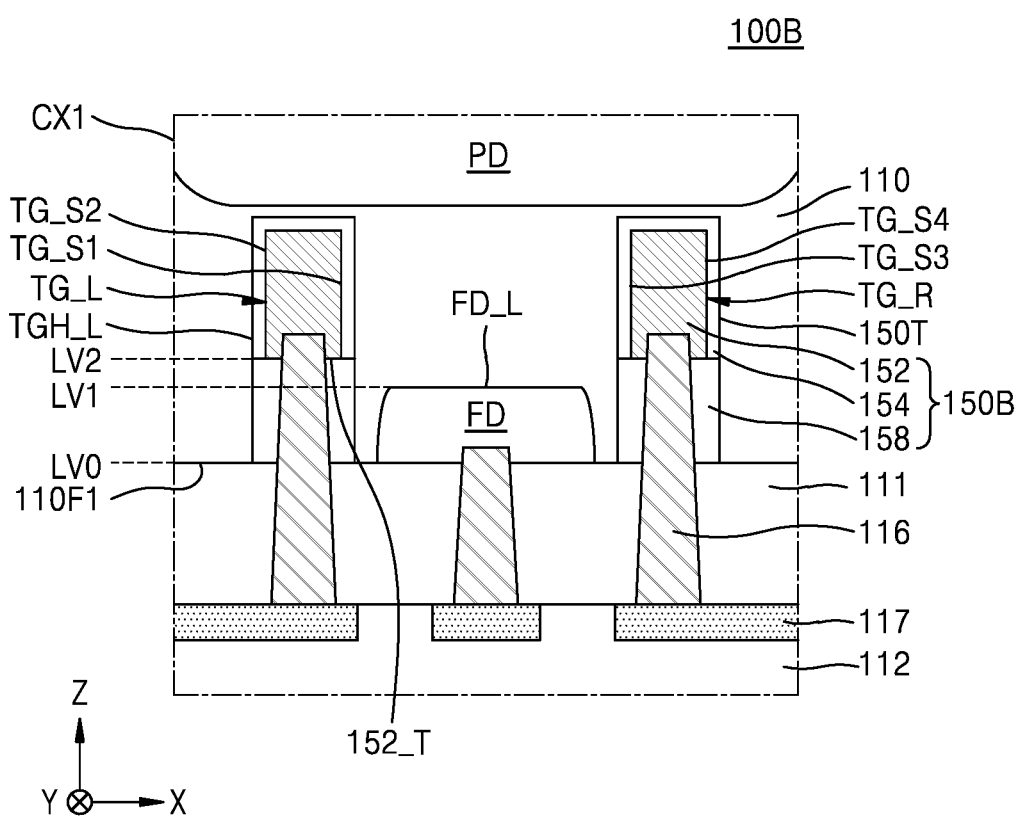
FIG. 10 is a magnified view of a part CX1 of FIG. 9.

FIG. 9 is a cross-sectional view illustrating an image sensor 100B according to example embodiments, and FIG. 10 is a magnified view of a part CX1 of FIG. 9. In FIGS. 9 and 10, like reference numerals in FIGS. 1 to 8 may denote like elements.

Referring to FIGS. 9 and 10, a buried gate structure 150B may include the gate electrode 152, the gate insulating layer 154, and a buried insulating layer 158 disposed within the buried gate trench 150T. The gate electrode 152 may be a recess gate-type gate electrode, and for example, the gate electrode 152 may be disposed within the buried gate trench 150T and might not extend to the first surface 110F1 of the first semiconductor substrate 110. For example, the gate electrode 152 might not fill an entrance of the buried gate trench 150T, and the buried insulating layer 158 on the gate electrode 152 may fill the entrance of the buried gate trench 150T.

The gate electrode 152 and the floating diffusion region FD may be at different vertical levels. For example, a top surface 152_T of the gate electrode 152 (as shown in FIG. 10, the surface of the gate electrode 152 closer to the first surface 110F1 of the first semiconductor substrate 110) may be at a higher vertical level than a bottom surface FD_L of the floating diffusion region FD (as shown in FIG. 10, the surface of the floating diffusion region FD farther from the first surface 110F1 of the first semiconductor substrate 110).

As shown in FIG. 10, the first surface 110F1 of the first semiconductor substrate 110 may be at a reference level LV0, the bottom surface FD_L of the floating diffusion region FD may be at a first vertical level LV1, and the top surface 152_T of the gate electrode 152 may be at a second vertical level LV2. The first vertical level LV1 may be closer to the reference level LV0 than the second vertical level LV2. For example, a distance from the first surface 110F1 of the first semiconductor substrate 110 to the top surface 152_T of the gate electrode 152 may be greater than a distance from the first surface 110F1 of the first semiconductor substrate 110 to the bottom surface FD_L of the floating diffusion region FD.

In some embodiments, the buried gate structure 150B has a semi-circular horizontal cross-section and at least partially surround both side parts of the floating diffusion region FD. In example embodiments, the buried gate structure 150B may have a ring-shaped horizontal cross-section (e.g., a ring-shaped horizontal cross-section at least partially surrounding the floating diffusion region FD in a plan view).

In general, the floating diffusion region FD may be disposed on one side of the transfer gate TG and may be configured to transfer charges from the photoelectric conversion region PD to the floating diffusion region FD by a voltage applied to the transfer gate TG. Along with a decrease in pixel sizes of image sensors, charge transfer efficiency may decrease because electrical coupling occurs between the transfer gate TG and the floating diffusion region FD, or unexpected charge movement from the photoelectric conversion region PD is caused by a field generated due to a voltage applied to the transfer gate TG.

However, according to the embodiments described above, because the buried gate structure 150B has a semi-circular planar shape at least partially surrounding both side parts of the floating diffusion region FD, charge transfer efficiency of charges transferred from the photoelectric conversion region PD to the floating diffusion region FD may be increased. Furthermore, because the buried gate structure 150B is at a different vertical level from that of the floating diffusion region FD, electrical coupling between the buried gate structure 150B and the floating diffusion region FD may be reduced or prevented.

Figure 11:
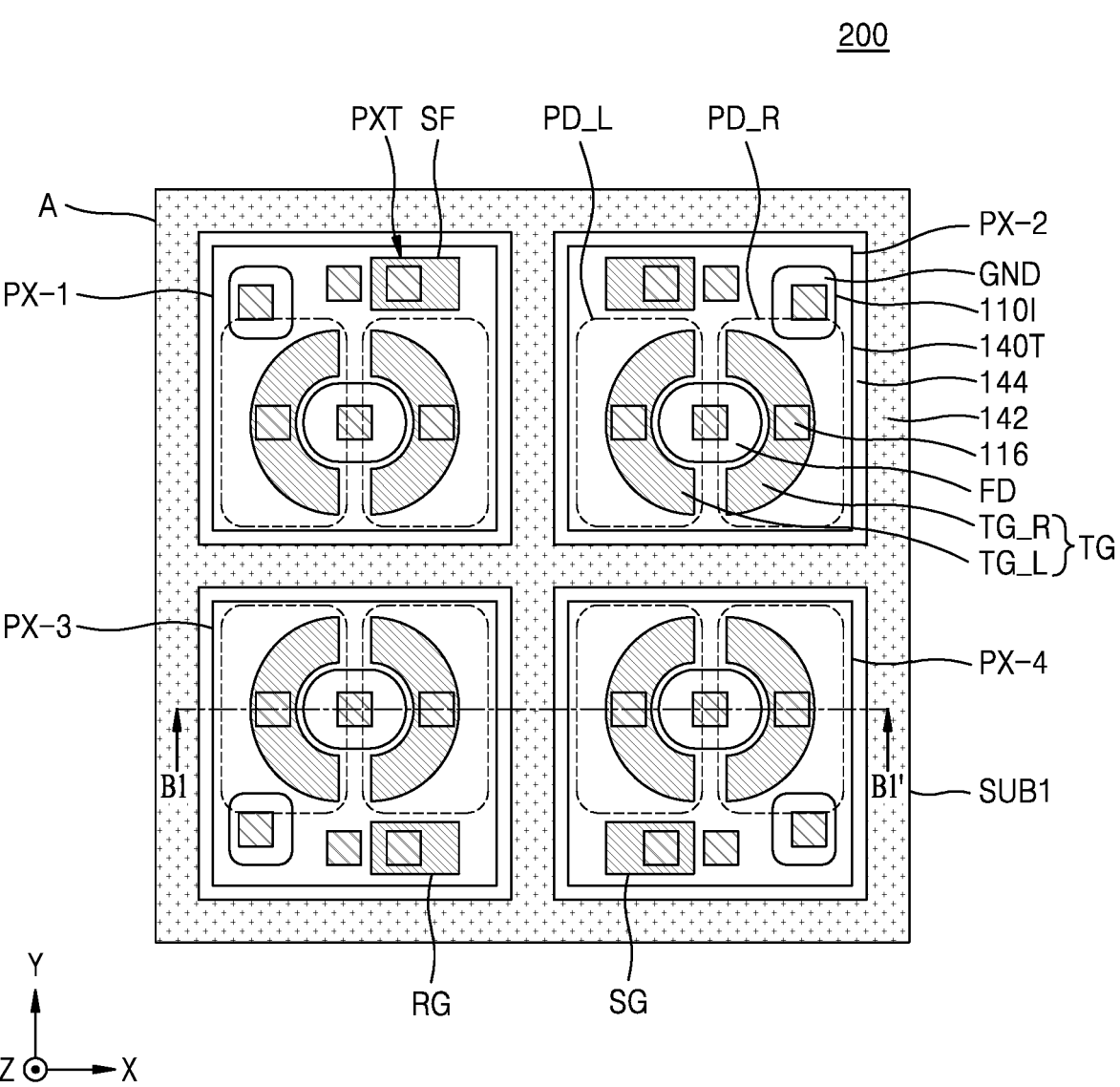
FIG. 11 is a layout diagram schematically illustrating an image sensor according to example embodiments.
Figure 12:
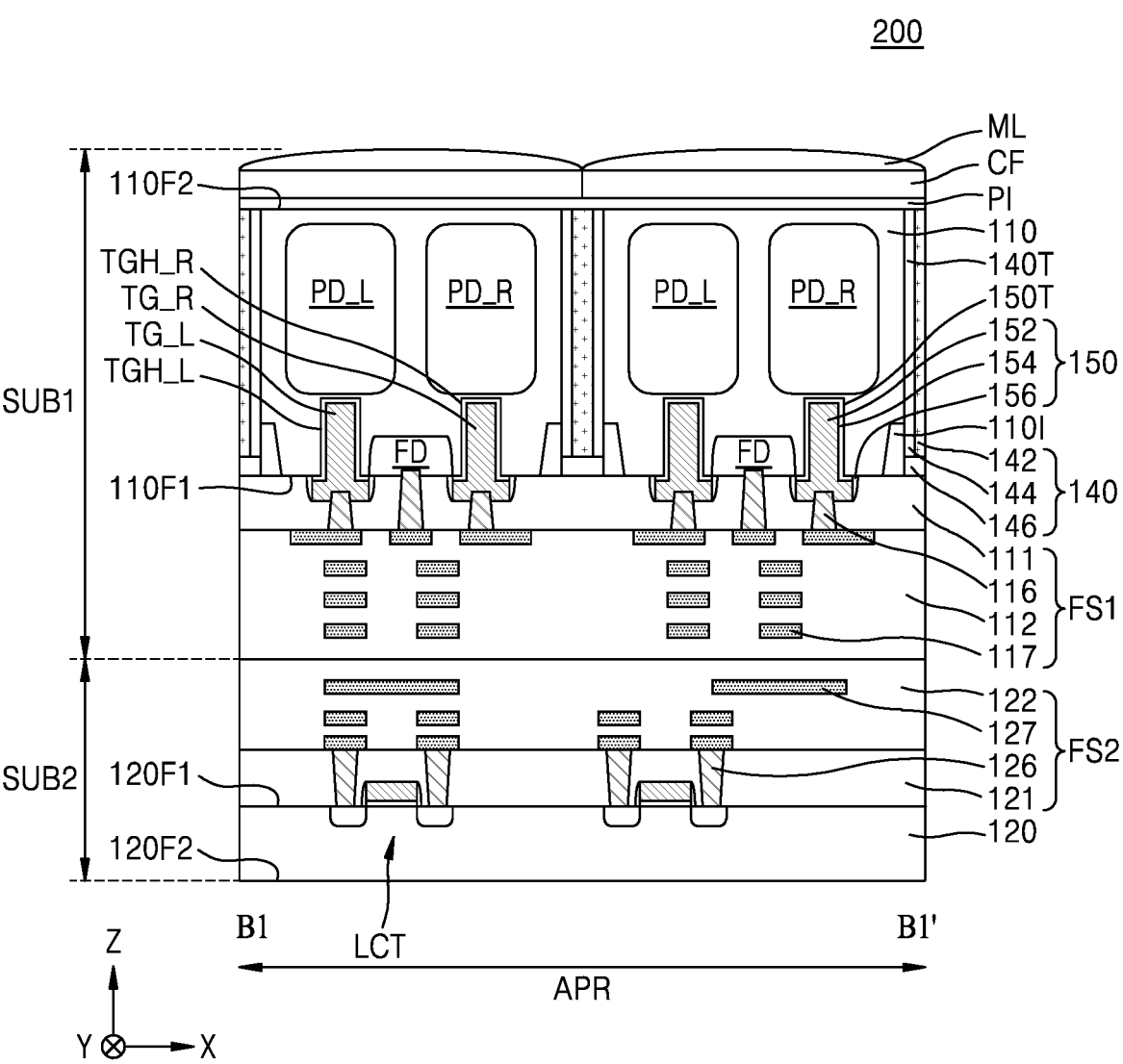
FIG. 12 is a cross-sectional view taken along line B1-B1' of FIG. 11.
Figure 13:
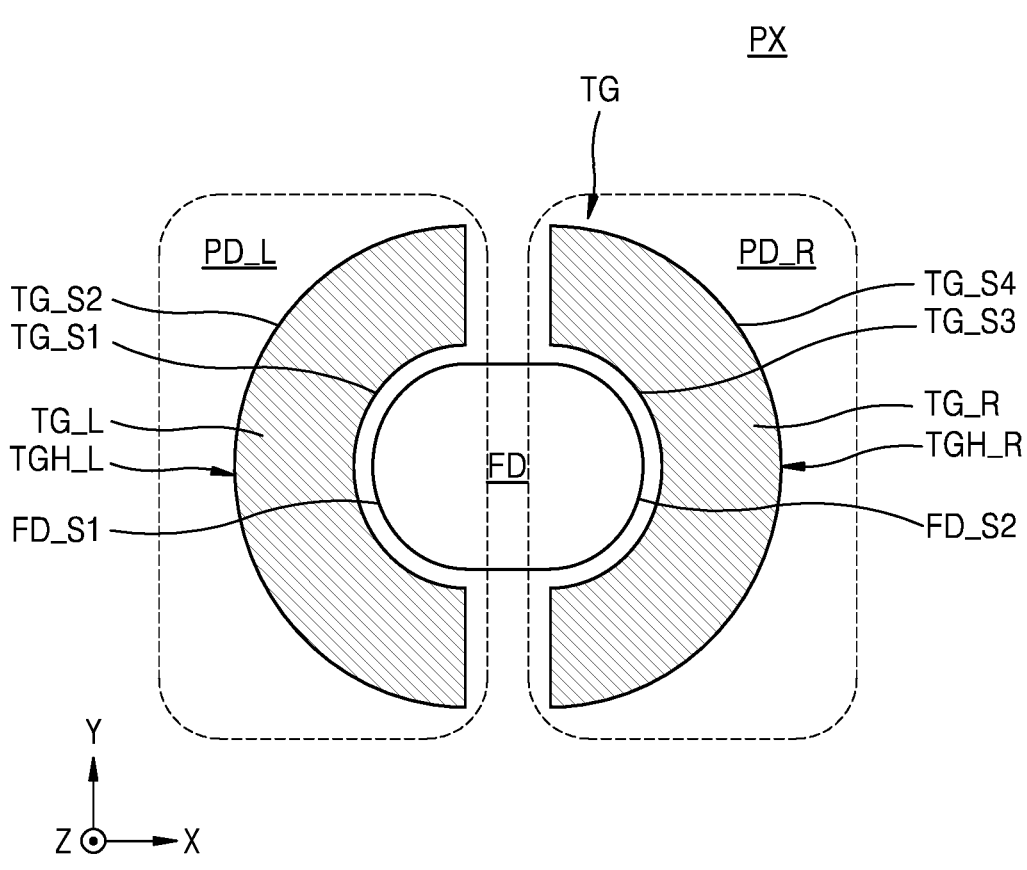
FIG. 13 is a layout diagram schematically illustrating an arrangement of a floating diffusion region and a transfer gate corresponding to one pixel.

FIG. 11 is a layout diagram schematically illustrating an image sensor 200 according to example embodiments. FIG. 12 is a cross-sectional view taken along line B1-B1' of FIG. 11. FIG. 13 is a layout diagram schematically illustrating an arrangement of the floating diffusion region FD and the transfer gate TG corresponding to one pixel PX. In. FIGS. 11 to 13, like reference numerals in FIGS. 1 to 10 may denote like elements.

Referring to FIGS. 11 to 13, the image sensor 200 may include a plurality of pixels PX, and in at least one of the plurality of pixels PX, a first photoelectric conversion region PD_L and a second photoelectric conversion region PD_R may be disposed within the first semiconductor substrate 110 of one pixel PX. In some embodiments, the first photoelectric conversion region PD_L and the second photoelectric conversion region PD_R may be disposed within each of the plurality of pixels PX.

As shown in FIG. 13, the first photoelectric conversion region PD_L and the second photoelectric conversion region PD_R may be spaced apart from each other and may respectively overlap the first buried gate electrode TG_L and the second buried gate electrode TG_R in the vertical direction. The first buried gate electrode TG_L may be driven to transfer charges stored in the first photoelectric conversion region PD_L to the floating diffusion region FD, and the second buried gate electrode TG_R may be driven to transfer charges stored in the second photoelectric conversion region PD_R to the floating diffusion region FD.

For example, when the first buried gate electrode TG_L coupled to the first photoelectric conversion region PD_L and the second buried gate electrode TG_R coupled to the second photoelectric conversion region PD_R are in one pixel PX, the one pixel PX may function as an autofocus (AF) pixel capable of detecting phase difference information. For example, the first buried gate electrode TG_L may transfer charges stored in the first photoelectric conversion region PD_L to the floating diffusion region FD, the second buried gate electrode TG_R may transfer charges stored in the second photoelectric conversion region PD_R to the floating diffusion region FD, and phase difference information may be derived by sensing a difference value between the charges stored in the first photoelectric conversion region PD_L and the charges stored in the second photoelectric conversion region PD_R.

According to the embodiments described above, the image sensor 200 includes the first buried gate electrode TG_L at least partially surrounding the first side part FD_S1 of the floating diffusion region FD and the second buried gate electrode TG_R at least partially surrounding the second side part FD_S2 of the floating diffusion region FD. Accordingly, charge transfer efficiency of charges transferred from the first photoelectric conversion region PD_L and the second photoelectric conversion region PD_R to the floating diffusion region FD may be increased. Accordingly, the image sensor 200 may have an excellent AF function.

Figure 14:
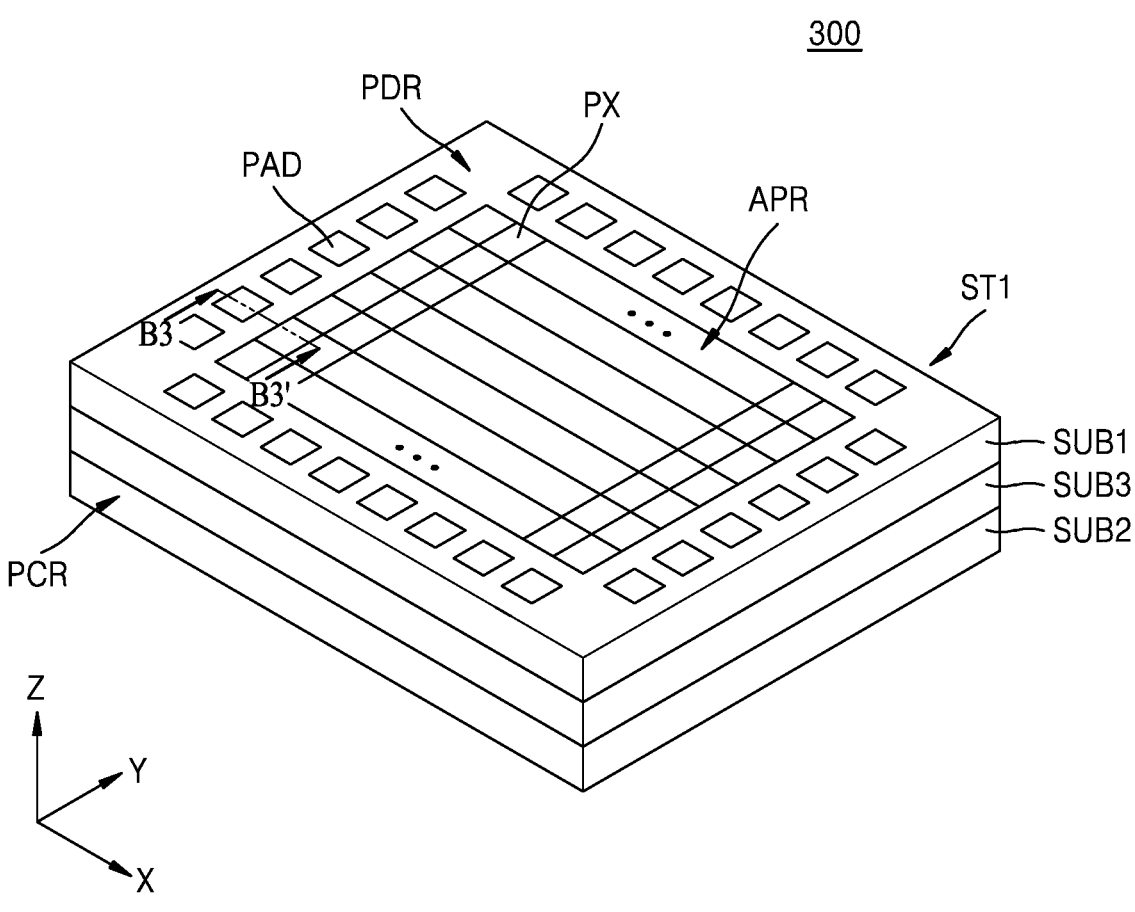
FIG. 14 is a perspective view schematically illustrating an image sensor according to an example embodiment.
Figure 15:
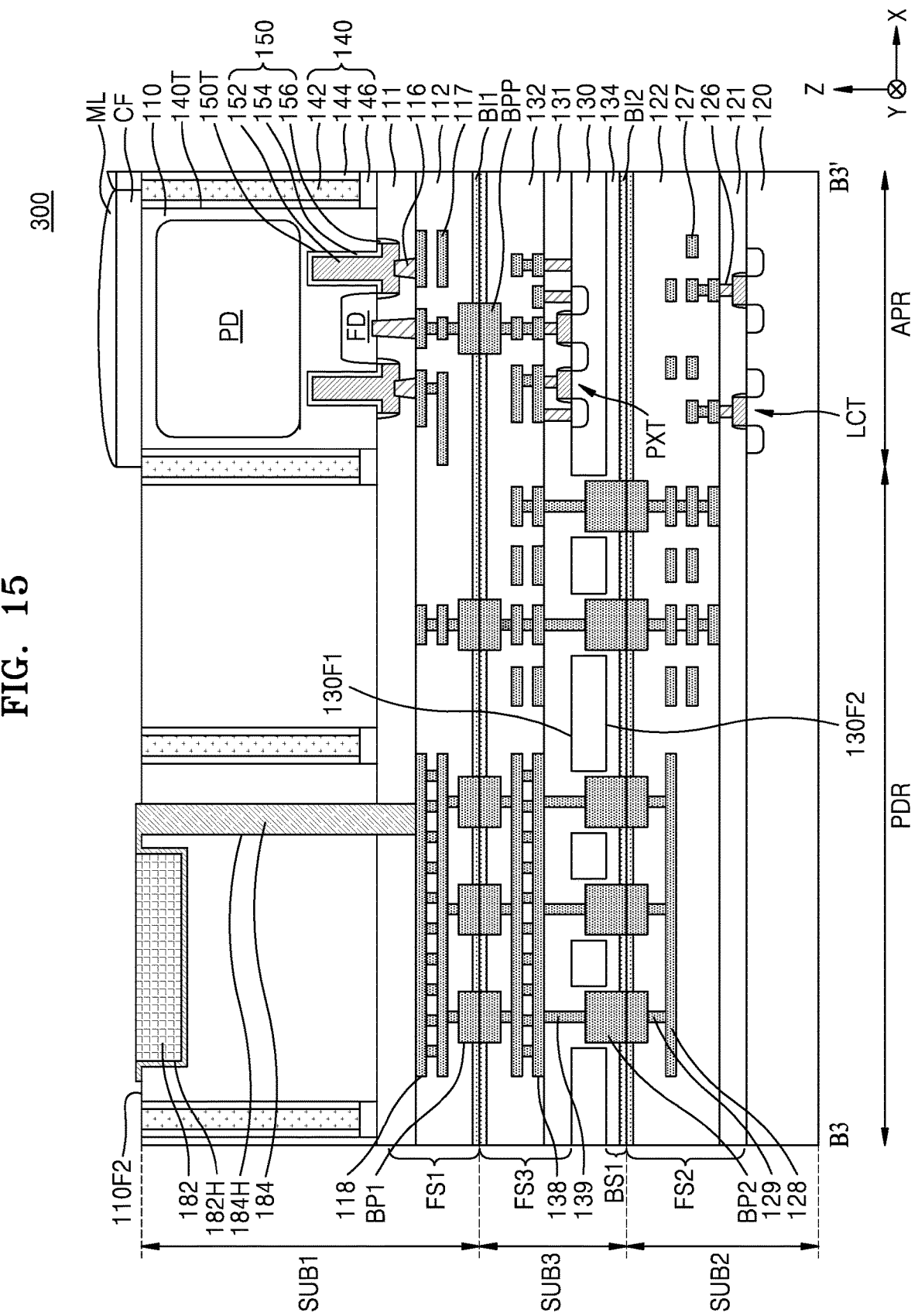
FIG. 15 is a cross-sectional view taken along line B3-B3' of FIG. 14.
Figure 16:
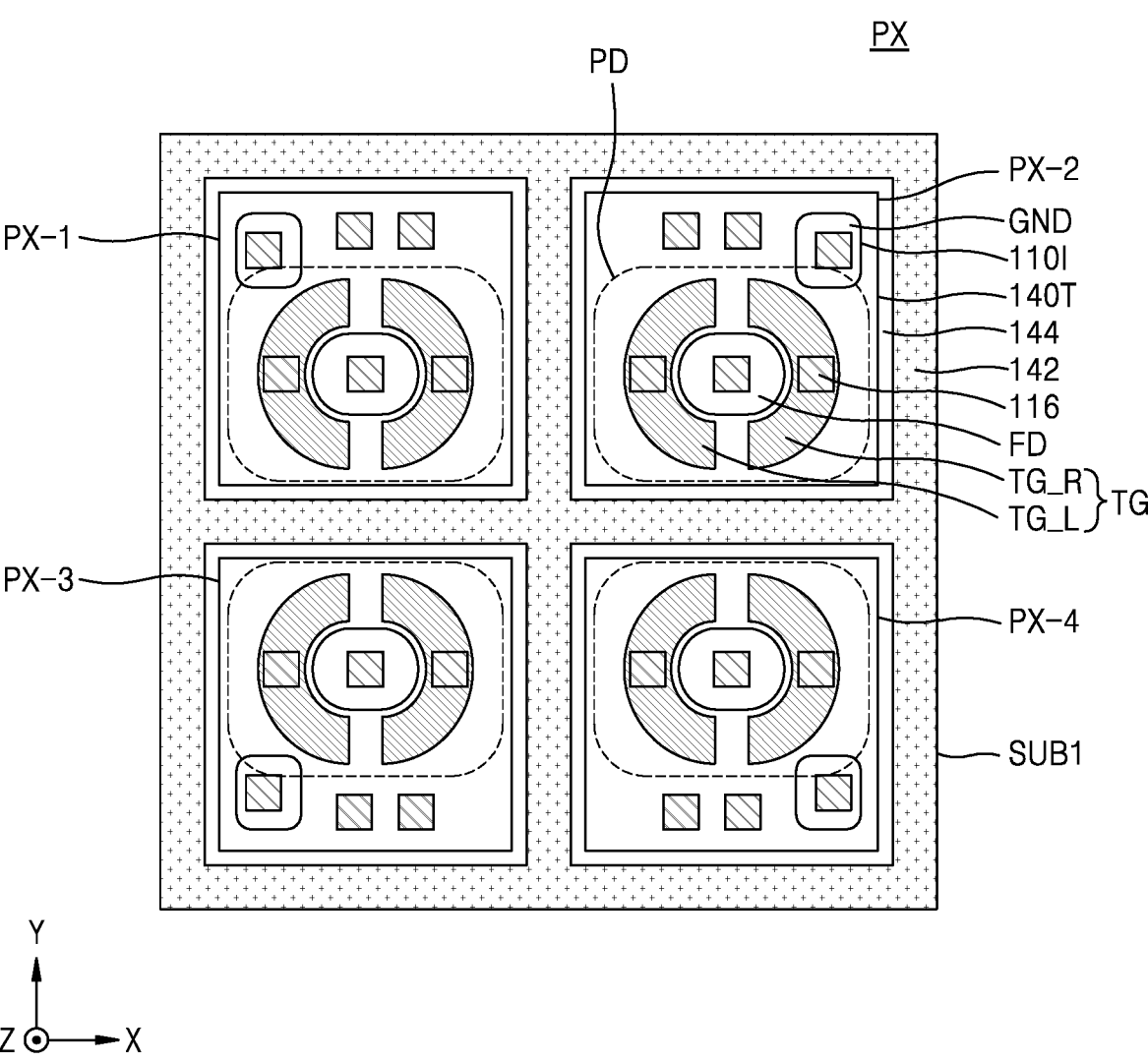
FIG. 16 is a layout diagram illustrating a first substrate corresponding to one pixel of FIG. 14.
Figure 17:
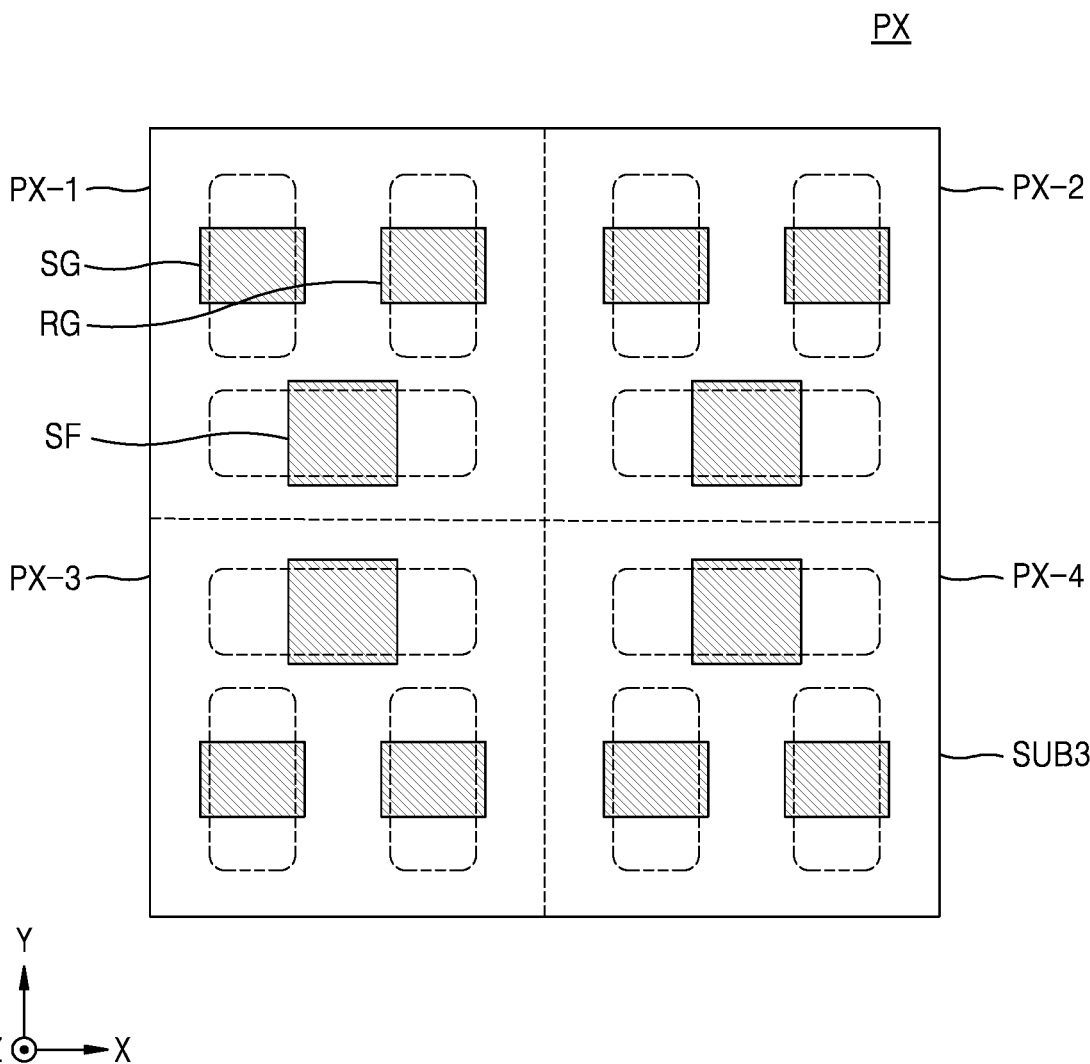
FIG. 17 is a layout diagram illustrating a third substrate corresponding to one pixel of FIG. 14.

FIG. 14 is a perspective view schematically illustrating an image sensor 300 according to example embodiments. FIG. 15 is a cross-sectional view taken along line B3-B3' of FIG. 14. FIG. 16 is a layout diagram illustrating the first substrate SUB1 corresponding to one pixel PX of FIG. 14. FIG. 17 is a layout diagram illustrating a third substrate SUB3 corresponding to one pixel PX of FIG. 14. In FIGS. 14 to 17, like reference numerals in FIGS. 1 to 13 may denote like elements.

Referring to FIGS. 14 to 17, the image sensor 300 may be a stack-type image sensor including the stack structure ST1 in which the first substrate SUB1, the third substrate SUB3, and the second substrate SUB2 are stacked in the vertical direction. The first substrate SUB1 and the third substrate SUB3 may be in contact with each other, and the third substrate SUB3 and the second substrate SUB2 may be in contact with each other.

The plurality of pixels PX may be disposed within the first substrate SUB1 and the third substrate SUB3, and for example, the photoelectric conversion region PD configured to receive light from the outside may be disposed within the first substrate SUB1, and the pixel gate PXT configured to convert photocharges accumulated in the photoelectric conversion region PD into an electrical signal may be disposed within the third substrate SUB3. The peripheral circuit region PCR may be disposed within the second substrate SUB2 and include the plurality of logic transistors LCT.

The first substrate SUB1 may include the first semiconductor substrate 110, the first front structure FS1 on the first surface 110F1 of the first semiconductor substrate 110, and the color filter CF and the microlens ML on the second surface 110F2 of the first semiconductor substrate 110. The second substrate SUB2 may include the second semiconductor substrate 120 and the second front structure FS2 on the first surface 120F1 of the second semiconductor substrate 120. The third substrate SUB3 may include a third semiconductor substrate 130, a third front structure FS3 on a first surface 130F1 of the third semiconductor substrate 130, and a back structure BS1 on a second surface 130F2 of the third semiconductor substrate 130. A pixel transistor may be disposed on the third semiconductor substrate 130. The first front structure FS1 and the third front structure FS3 may face and be in contact with each other, and the back structure BS1 and the second front structure FS2 may face and be in contact with each other.

The third front structure FS3 may include a first insulating layer 131 and a second insulating layer 132 on the first surface 130F1 of the third semiconductor substrate 130, and the back structure BS1 may include a third insulating layer 134 on the second surface 130F2 of the third semiconductor substrate 130. A first bonding layer BI1 may be disposed between the first front structure FS1 and the third front structure FS3, and a second bonding layer BI2 may be disposed between the back structure BS1 and the second front structure FS2. Each of the first bonding layer BI1 and the second bonding layer BI2 may be formed in a stack structure of a plurality of insulating layers and include, for example, silicon oxide, silicon nitride, silicon oxynitride, and/or silicon carbonitride.

In the pad region PDR, a first bonding pad BP1 may be disposed on an interface between the first substrate SUB1 and the third substrate SUB3. The first bonding pad BP1 may include an upper pad part and a lower pad part, and the upper pad part and the lower pad part may overlap in the vertical direction and adhere to each other. For example, an interface, e.g., a bonding interface, between the upper pad pan and the lower pad part may be disposed between the first front structure FS1 and the third front structure FS3. For example, the first substrate SUB1 and the third substrate SUB3 may be stacked by a metal-oxide hybrid bonding.

In the pad region PDR, a second bonding pad BP2 may be disposed on an interface between the second substrate SUB2 and the third substrate SUB3. The second substrate SUB2 and the third substrate SUB3 may be stacked by a metal-oxide hybrid bonding.

The photoelectric conversion region PD and/or the floating diffusion region FD in the first substrate SUB1 of one pixel PX may be connected, through a pixel bonding pad BPP, to the pixel gate PXT inside the third substrate SUB3 of the one pixel PX. For example, the pixel bonding pad BPP may include an upper pad part and a lower pad part, and the upper pad part and the lower pad part may overlap in the vertical direction and adhere to each other.

Each of the pixel bonding pad BPP, the first bonding pad BP1, and the second bonding pad BP2 may include a barrier layer and a metal layer. For example, the barrier layer may cover a side surface and a lower surface of the metal layer. For example, the barrier layer may include Ti, Ta, TiN, and/or TaN, and the metal layer may include Cu, gold (Au), nickel (Ni), Al, W, or a combination thereof. For example, the metal layer in the upper pad part and the metal layer in the lower pad part may be bonded by mutual diffusion of metal atoms through high-temperature annealing.

In the pad region PDR, a pad opening part 182H may be disposed on the second surface 110F2 of the first semiconductor substrate 110, and a pad 182 may be disposed within the pad opening part 182H. A vertical via hole 184H passing through the first semiconductor substrate 110 may be arranged, a vertical via 184 may be disposed within the vertical via hole 184H, and the vertical via 184 may be electrically connected to the pad 182.

The pad 182 may be electrically connected to the first bonding pad BP1 through a pad wiring layer 118 in the first front structure FS1, electrically connected to a pad wiring layer 138 and a pad via 139 in the third front structure FS3 and the second bonding pad BP2 through the first bonding pad BP1, and electrically connected to a pad via 129 and a pad wiring layer 128 in the second front structure FS2 through the second bonding pad BP2. By doing this, power and a signal from an external device may be transferred to the logic transistor LCT disposed within the second substrate SUB2.

Although FIG. 16 shows that the transfer gate TG (or the buried gate structure 150) has a semi-circular horizontal cross-section and may at least partially surround both side parts of the floating diffusion region FD, in example embodiments, the buried gate structure 150 may have a ring-shaped horizontal cross-section (e.g., a ring-shaped horizontal cross-section at least partially surrounding the floating diffusion region FD in a plan view).

According to the embodiments described above, the photoelectric conversion region PD and the transfer gate TG of a pixel PX may be disposed within the first substrate SUB1, and the pixel gate PXT may be disposed within the third substrate SUB3 attached to the first substrate SUB1 through the pixel bonding pad BPP. Accordingly, a size of a pixel PX may decrease, and the resolution of the image sensor 300 may be increased.

Figure 18:
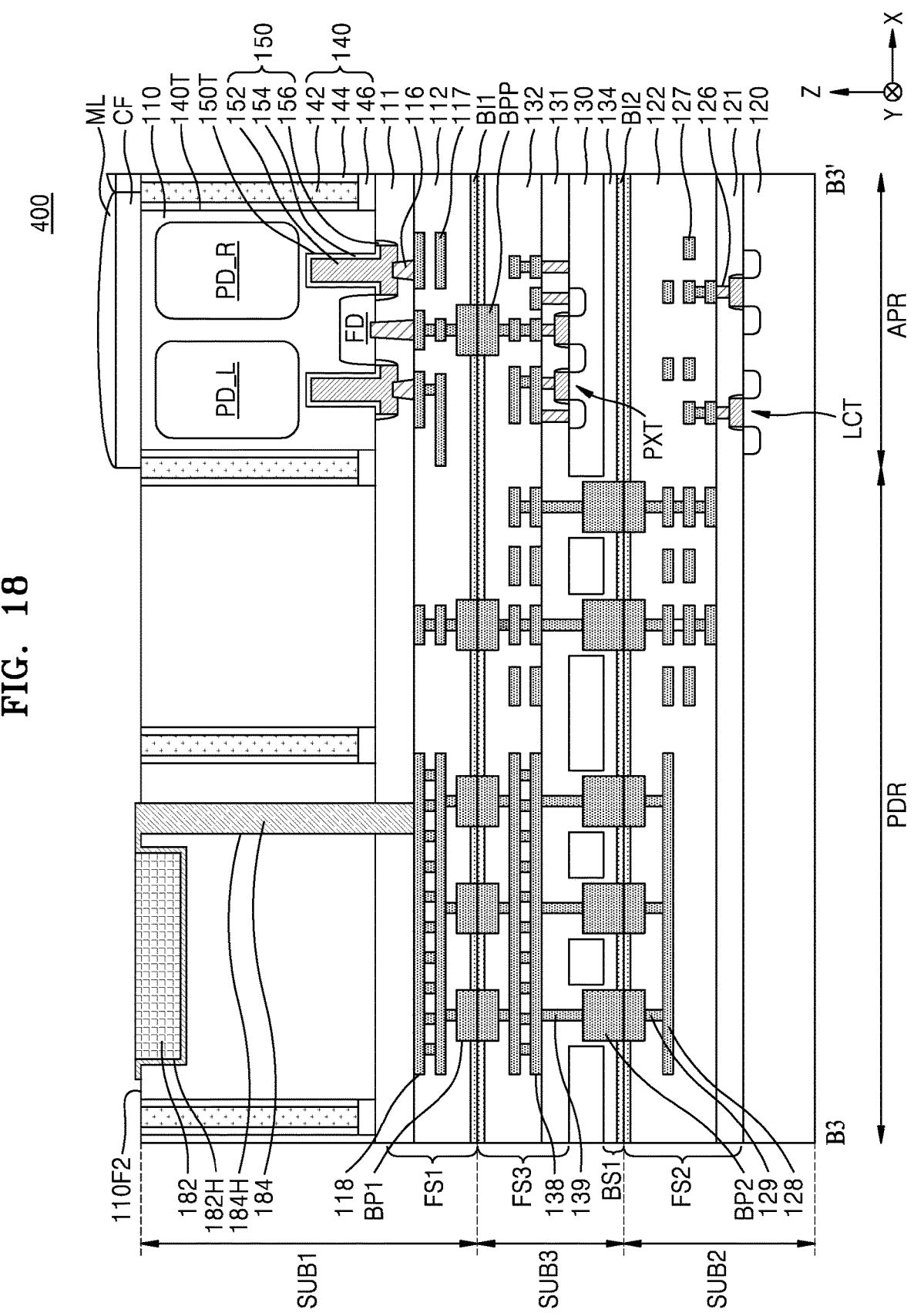
FIG. 18 is a cross-sectional view illustrating an image sensor according to example embodiments.
Figure 19:
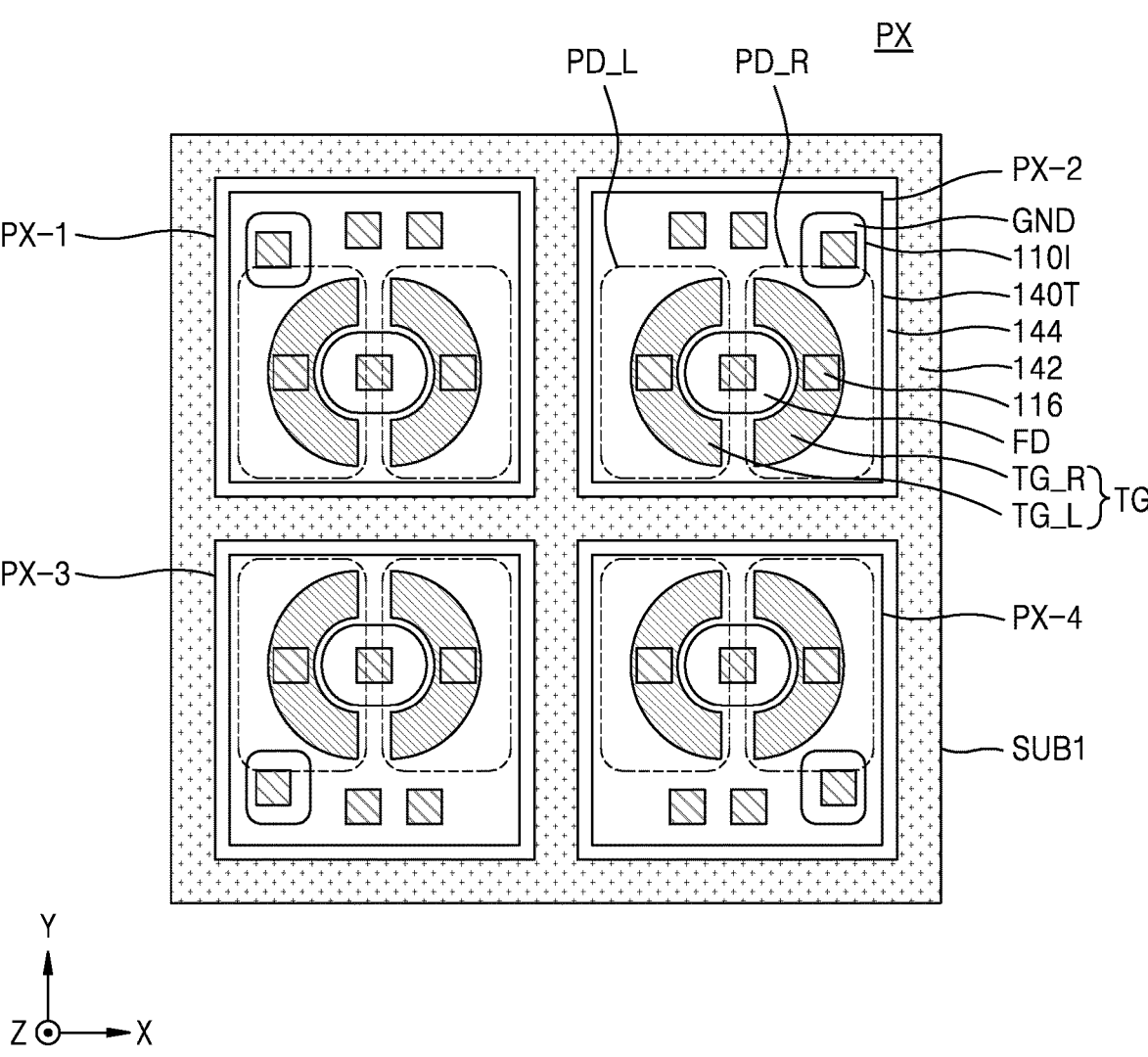
FIG. 19 is a layout diagram illustrating a first substrate corresponding to one pixel of FIG. 18.
Figure 20:
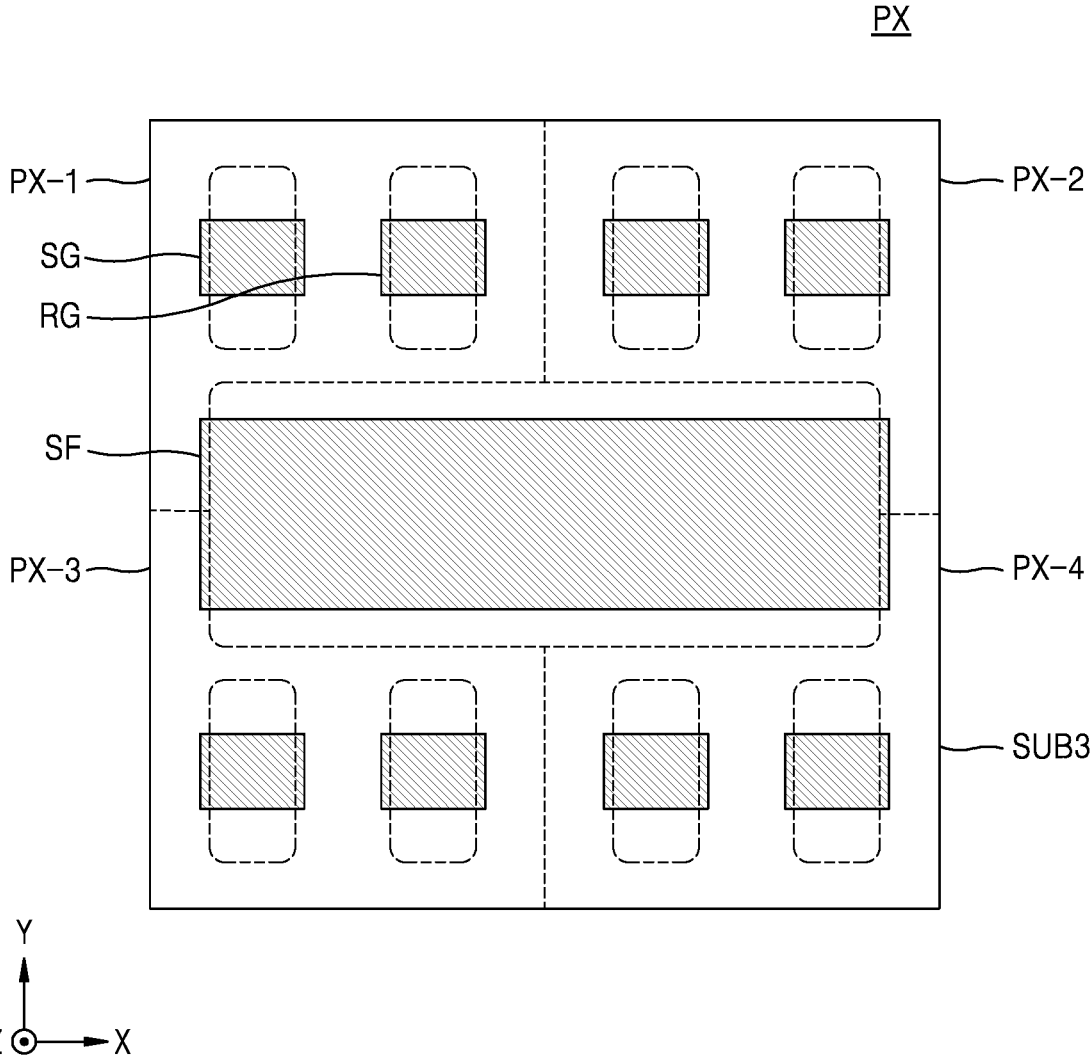
FIG. 20 is a layout diagram illustrating a third substrate corresponding to one pixel of FIG. 18.

FIG. 18 is a cross-sectional view illustrating an image sensor 400 according to example embodiments. FIG. 19 is a layout diagram illustrating the first substrate SUB1 corresponding to one pixel PX of FIG. 18. FIG. 20 is a layout diagram illustrating the third substrate SUB3 corresponding to one pixel PX of FIG. 18. In FIGS. 18 to 20, like reference numerals in FIGS. 1 to 17 may denote like elements.

Referring to FIGS. 18 to 20, in at least one of a plurality of pixels PX, the first photoelectric conversion region PD_L and the second photoelectric conversion region PD_R may be disposed within the first semiconductor substrate 110 of one pixel PX. In some embodiments, the first photoelectric conversion region PD_L and the second photoelectric conversion region PD_R may be disposed within each of the plurality of pixels PX.

As shown in FIG. 19, the first photoelectric conversion region PD_L and the second photoelectric conversion region PD_R may be spaced apart from each other and respectively overlap the first buried gate electrode TG_L and the second buried gate electrode TG_R in the vertical direction. The first buried gate electrode TG_L may be driven to transfer charges stored in the first photoelectric conversion region PD_L to the floating diffusion region FD, and the second buried gate electrode TG_R may be driven to transfer charges stored in the second photoelectric conversion region PD_R to the floating diffusion region FD.

Although FIG. 20 shows a layout of a 2*2 sharing pixel in which the first to fourth pixels PX-1, PX-2, PX-3, and PX-4 share one source follower gate SF, the inventive concept is not necessarily limited thereto.

Figure 21:
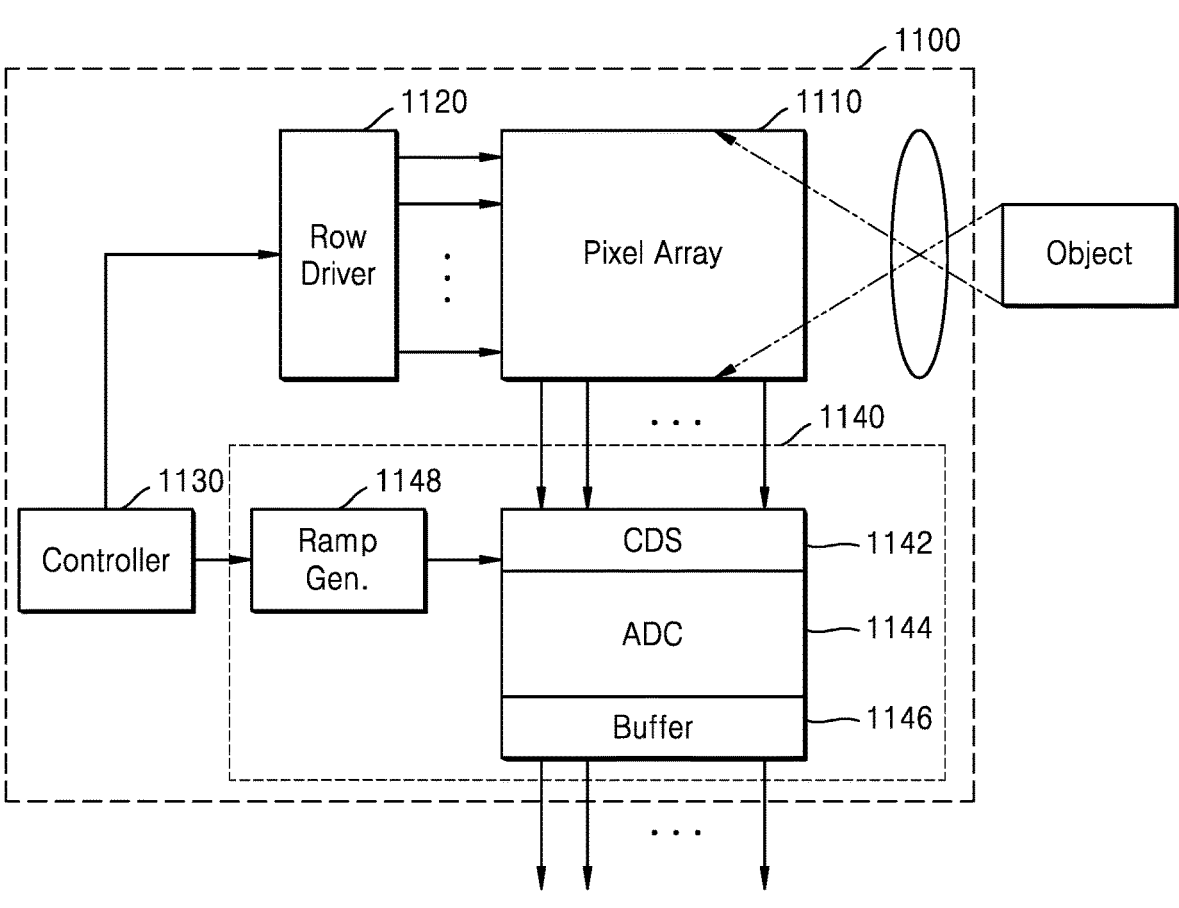
FIG. 21 is a block diagram of an image sensor according to an example embodiment.

FIG. 21 is a block diagram of an image sensor 1100 according to an example embodiment.

Referring to FIG. 21, the image sensor 1100 may include a pixel array 1110, a controller 1130, a row driver 1120, and a pixel signal processor 1140. The image sensor 1100 includes images sensors 100, 100A, 100B, 200, 300, and/or 400 described with reference to FIGS. 1 to 20.

The pixel array 1110 may include a plurality of unit pixels which are two-dimensionally arranged, and each unit pixel may include a photoelectric conversion device. The photoelectric conversion device may generate charges by absorbing light, and an electrical signal (output voltage) according to the generated charges may be provided to the pixel signal processor 1140 through a vertical signal line. The plurality of unit pixels included in the pixel array 1110 may provide an output voltage one by one in a row unit, and accordingly, unit pixels belonging to one row of the pixel array 1110 may be activated at the same time by a select signal output from the row driver 1120. Unit pixels belonging to a selected row may provide an output voltage according to absorbed light to an output line of a corresponding column.

The controller 1130 may control the row driver 1120 so that the pixel array 1110 accumulates charges by absorbing light or temporarily stores the accumulated charges and outputs an electrical signal according to the stored charges to the outside of the pixel array 1110. In addition, the controller 1130 may control the pixel signal processor 1140 to measure the output voltage provided by the pixel array 1110.

The pixel signal processor 1140 may include a CDS 1142, an analog-digital converter (ADC) 1144, and a buffer 1146. The CDS 1142 may sample and hold the output voltage provided by the pixel array 1110. The CDS 1142 may double-sample a particular noise level and a level according to a generated output voltage and output a level corresponding to a difference therebetween. In addition, the CDS 1142 may receive a ramp signal generated by a ramp signal generator 1148 and output a comparison result through comparison.

The ADC 1144 may convert an analog signal into a digital signal corresponding to the level received from the CDS 1142. The buffer 1146 may latch the digital signal, and the latched signal may be sequentially output to the outside of the image sensor 1100 and transferred to an image processor.

While the inventive concept has been particularly shown and described with reference to embodiments thereof, it will be understood that various changes in form and details may be made therein without departing from the spirit and scope of the present disclosure.

What is claimed is:

1. An image sensor, comprising:
a semiconductor substrate including a first surface and a second surface, the semiconductor substrate having a photoelectric conversion region disposed therein;
a floating diffusion region disposed within the semiconductor substrate, the floating diffusion region being adjacent to the first surface;
a buried gate structure disposed within a buried gate trench that is recessed with respect to the first surface, the buried gate trench extending from the first surface of the semiconductor substrate towards an interior of the semiconductor substrate, the buried gate structure comprising:
a first buried gate electrode disposed within a first buried gate trench, recessed with respect to the first surface, the first buried gate electrode being adjacent to a first side part of the floating diffusion region, the first buried gate electrode having a semi-annular horizontal cross-section, and
a second buried gate electrode disposed within a second buried gate trench, recessed with respect to the first surface, the second buried gate electrode being spaced apart from the first buried gate trench and adjacent to a second side part of the floating diffusion region that is opposite to the first side part, the second buried gate electrode having a semi-annular horizontal cross-section;

a first conductive via extending from the first buried gate electrode to connect to a first pattern of one wiring layer;

a second conductive via extending from the second buried gate electrode to connect to a second pattern of the one wiring layer; and a third conductive via extending from the floating diffusion region to connect to a third pattern of the one wiring layer.

2. The image sensor of claim 1, wherein the first buried gate electrode and the second buried gate electrode collectively surround a periphery of the floating diffusion region in a plan view.

3. The image sensor of claim 1, wherein the image sensor further comprises a plurality of pixels disposed within the semiconductor substrate, wherein the photoelectric conversion region is disposed within each of the plurality of pixels, and wherein the photoelectric conversion region extends continuously to at least partially overlap both the first buried gate electrode and the second buried gate electrode.

4. The image sensor of claim 1, wherein the first buried gate electrode comprises:

a first side wall facing the first side part of the floating diffusion region; and a second side wall opposite to the first side wall, wherein the second buried gate electrode comprises:

a third side wall facing the second side part of the floating diffusion region; and a fourth side wall opposite to the third side wall, wherein the first side wall and the third side wall are mirror symmetrical with respect to each other with the floating diffusion region disposed therebetween, and wherein the second side wall and the fourth side wall are mirror symmetrical with respect to each other with the floating diffusion region disposed therebetween.

5. The image sensor of claim 4, wherein the floating diffusion region has a circular horizontal cross-section, the first buried gate electrode surrounds at least a part of the floating diffusion region, and the second buried gate electrode surrounds at least another part of the floating diffusion region.

6. The image sensor of claim 1, wherein the first buried gate electrode and the second buried gate electrode are mirror symmetrical with respect to each other.

7. The image sensor of claim 1, wherein the image sensor comprises a plurality of pixels disposed within the semiconductor substrate, the photoelectric conversion region in each of the plurality of pixels comprises a first photoelectric conversion region and a second photoelectric conversion region spaced apart from the first photoelectric conversion region, the first photoelectric conversion region at least partially overlaps the first buried gate electrode, and the second photoelectric conversion region at least partially overlaps the second buried gate electrode.

8. The image sensor of claim 1, wherein the first buried gate electrode and the second buried gate electrode have upper surfaces at a higher level than a level of the first surface of the semiconductor substrate, and the first buried gate electrode and the second buried gate electrode extend from the first surface towards an interior of the semiconductor substrate, wherein the second surface of the semiconductor substrate is defined as being higher than the first surface of the semiconductor substrate.

9. The image sensor of claim 1, wherein the first buried gate electrode and the second buried gate electrode have bottom surfaces at a higher level than a level of the first surface of the semiconductor substrate, and the image sensor further comprises a buried insulating layer disposed on the bottom surface of the first buried gate electrode and in a bottom portion of the first buried gate trench and disposed on the bottom surface of the second buried gate electrode and in a bottom portion of the second buried gate trench, wherein the second surface of the semiconductor substrate is defined as being higher than the first surface of the semiconductor substrate.

10. An image sensor, comprising:

a stack structure including a first substrate and a second substrate that is stacked upon the first substrate, an active pixel region in which a plurality of pixels is defined, and a pad region disposed on at least one side of the active pixel region, wherein the first substrate comprises:

a first semiconductor substrate including a first surface and a second surface, the first semiconductor substrate having a photoelectric conversion region disposed therein;

a first buried gate electrode having at least a part extending from the first surface of the first semiconductor substrate towards an interior of the first semiconductor substrate, the first buried gate electrode having a semi-annular horizontal cross-section;

a second buried gate electrode having at least a part extending from the first surface of the first semiconductor substrate towards an interior of the first semiconductor substrate, the second buried gate electrode being spaced apart from the first buried gate electrode, the second buried gate electrode having a semi-annular horizontal cross-section;

a floating diffusion region disposed within the first semiconductor substrate and at least partially surrounded by the first buried gate electrode and the second buried gate electrode;

a first conductive via extending from the first buried gate electrode to connect to a first pattern of one wiring layer;

a second conductive via extending from the second buried gate electrode to connect to a second pattern of the one wiring layer; and a third conductive via extending from the floating diffusion region to connect to a third pattern of the one wiring layer.

11. The image sensor of claim 10, wherein the photoelectric conversion region extends continuously to at least partially overlap both the first buried gate electrode and the second buried gate electrode.

12. The image sensor of claim 10, wherein the first buried gate electrode comprises:

a first side wall facing a first side part of the floating diffusion region; and a second side wall opposite to the first side wall, wherein the second buried gate electrode comprises:

a third side wall facing a second side part of the floating diffusion region; and a fourth side wall opposite to the third side wall, wherein the first side wall and the third side wall are mirror symmetrical with respect to each other with the floating diffusion region disposed therebetween, and wherein the second side wall and the fourth side wall are mirror symmetrical with respect to each other with the floating diffusion region therebetween.

13. The image sensor of claim 10, wherein the photoelectric conversion region in each of the plurality of pixels comprises a first photoelectric conversion region and a second photoelectric conversion region spaced apart from the first photoelectric conversion region, the first photoelectric conversion region at least partially overlapping the first buried gate electrode, and the second photoelectric conversion region at least partially overlapping the second buried gate electrode.

14. The image sensor of claim 10, wherein the second substrate comprises a logic circuit configured to drive the plurality of pixels.

15. The image sensor of claim 14, wherein the first substrate further comprises a pixel transistor disposed on the first surface of the first semiconductor substrate, the pixel transistor being electrically connected to the plurality of pixels.

16. The image sensor of claim 14, wherein the stack structure further comprises a third substrate disposed between the first substrate and the second substrate, the third substrate comprising:
  a third semiconductor substrate;
  a pixel transistor disposed on the third semiconductor substrate and electrically connected to the plurality of pixels; and
  a pixel bonding pad electrically connecting the pixel transistor to the floating diffusion region.

17. An image sensor, comprising:
  a stack structure including a first substrate and a second substrate that is stacked on the first substrate, an active pixel region in which a plurality of pixels is defined, and a pad region disposed on at least one side of the active pixel region,
  wherein the first substrate comprises:
  a first semiconductor substrate including a first surface and a second surface, the first semiconductor substrate having a photoelectric conversion region disposed therein;
  a floating diffusion region disposed within the first semiconductor substrate, the floating diffusion region being adjacent to the first surface;
  a first buried gate electrode disposed within a first buried gate trench that is recessed with respect to the first surface, the first buried gate trench extending from the first surface of the first semiconductor substrate towards an interior of the first semiconductor substrate, and on a first side part of the floating diffusion region, the first buried gate electrode having a semi-annular horizontal cross-section;

a second buried gate electrode disposed within a second buried gate trench that is recessed with respect to the first surface, the second buried gate trench extending from the first surface of the first semiconductor substrate towards the interior of the first semiconductor substrate and spaced apart from the first buried gate trench, and on a second side part of the floating diffusion region, the second side part being opposite to the first side part, the second buried gate electrode having a semi-annular horizontal cross-section;
  a first conductive via extending from the first buried gate electrode to connect to a first pattern of one wiring layer;
  a second conductive via extending from the second buried gate electrode to connect to a second pattern of the one wiring layer; and
a third conductive via extending from the floating diffusion region to connect to a third pattern of the one wiring layer,
  wherein each of the first buried gate electrode and the second buried gate electrode at least partially surround the floating diffusion region, and the second substrate comprises a logic circuit configured to drive the plurality of pixels.

18. The image sensor of claim 17, wherein the first buried gate electrode and the second buried gate electrode are mirror symmetrical with respect to each other.

19. The image sensor of claim 17, wherein the floating diffusion region has a circular horizontal cross-section, the first buried gate electrode surrounds at least a first part of the floating diffusion region, and the second buried gate electrode surrounds at least a second part of the floating diffusion region.

20. The image sensor of claim 17, wherein the first buried gate electrode and the second buried gate electrode have upper surfaces at a higher level than a level of the first surface of the first semiconductor substrate, and the first buried gate electrode and the second buried gate electrode extend from the first surface to inside the first semiconductor substrate,
  wherein the second surface of the semiconductor substrate is defined as being higher than the first surface of the semiconductor substrate.

* * * * *